US012669749B2

(12) United States Patent
Okawa et al.

(10) Patent No.: US 12,669,749 B2
(45) Date of Patent: Jun. 30, 2026

(54) CURABLE RESIN COMPOSITION FOR SILICON-CONTAINING RESIST, PATTERN FORMING METHOD, METHOD FOR PRODUCING IMPRINT MOLD, AND METHOD FOR PRODUCING SEMICONDUCTOR DEVICE

(71) Applicant: DAI NIPPON PRINTING CO., LTD., Tokyo-to (JP)

(72) Inventors: Yasuhiro Okawa, Tokyo-to (JP); Shintaro Nasu, Tokyo-to (JP); Masakazu Kaneko, Tokyo-to (JP); Hirokazu Oda, Tokyo-to (JP)

(73) Assignee: DAI NIPPON PRINTING CO., LTD., Tokyo (JP)

( * ) Notice: Subject to any disclaimer, the term of this patent is extended or adjusted under 35 U.S.C. 154(b) by 538 days.

(21) Appl. No.: 18/029,481

(22) PCT Filed: Oct. 6, 2021

(86) PCT No.: PCT/JP2021/036980
§ 371 (c)(1),
(2) Date: Mar. 30, 2023

(87) PCT Pub. No.: WO2022/075361
PCT Pub. Date: Apr. 14, 2022

(65) Prior Publication Data

US 2024/0004294 A1 Jan. 4, 2024

(30) Foreign Application Priority Data

Oct. 7, 2020 (JP) ................................ 2020-170090

(51) Int. Cl.
*G03F 7/075* (2006.01)
*B29C 33/38* (2006.01)
(Continued)

(52) U.S. Cl.
CPC ........ *G03F 7/0755* (2013.01); *B29C 33/3842* (2013.01); *B29C 33/42* (2013.01);
(Continued)

(58) Field of Classification Search
None
See application file for complete search history.

(56) References Cited

U.S. PATENT DOCUMENTS

2008/0292976 A1 11/2008 Terasaki et al.
2010/0109195 A1 5/2010 Xu et al.
(Continued)

FOREIGN PATENT DOCUMENTS

CN 101122742 A 2/2008
JP 5144127 B2 2/2013
(Continued)

OTHER PUBLICATIONS

Jan. 11, 2022 Search Report issued in International Patent Application No. PCT/JP2021/036980.

*Primary Examiner* — Jiong-Ping Lu
(74) *Attorney, Agent, or Firm* — Oliff PLC

(57) ABSTRACT

A curable resin composition for silicon-containing resist including a polymerizable compound, and a polymerization initiator, wherein the polymerizable compound includes a siloxane bond in a molecule, and includes at least one polymerizable functional group; and a ratio of oxygen atoms bonded to a single silicon atom, among oxygen atoms bonded to a silicon atom included in the polymerizable compound, is 10 mol % or less; and the curable resin composition for silicon-containing resist does not contain a solvent, and a viscosity is 20 cPs or less.

11 Claims, 6 Drawing Sheets

(51) Int. Cl.

| | |
|---|---|
| ***B29C 33/42*** | (2006.01) |
| ***C08F 230/08*** | (2006.01) |
| ***C08F 292/00*** | (2006.01) |
| ***G03F 7/00*** | (2006.01) |
| ***G03F 7/004*** | (2006.01) |
| ***G03F 7/40*** | (2006.01) |
| ***H10P 50/00*** | (2026.01) |
| ***H10P 76/00*** | (2026.01) |
| ***H10P 76/40*** | (2026.01) |
| *B29C 59/02* | (2006.01) |

(52) U.S. Cl.
CPC .......... *C08F 230/08* (2013.01); *C08F 292/00* (2013.01); *G03F 7/0002* (2013.01); *G03F 7/004* (2013.01); *G03F 7/075* (2013.01); *G03F 7/40* (2013.01); *H10P 50/695* (2026.01); *H10P 50/73* (2026.01); *H10P 76/00* (2026.01); *H10P 76/405* (2026.01); *B29C 59/02* (2013.01)

(56) References Cited

U.S. PATENT DOCUMENTS

| | | | |
|---|---|---|---|
| 2012/0292793 A1 | 11/2012 | Koike et al. | |
| 2022/0169774 A1 * | 6/2022 | Oda | ...................... B29C 59/046 |

FOREIGN PATENT DOCUMENTS

| | | | |
|---|---|---|---|
| JP | 5714496 | B2 | 5/2015 |
| JP | 5889388 | B2 | 3/2016 |
| JP | 2018-98470 | A | 6/2018 |
| KR | 1020090031274 | A | 3/2009 |
| WO | 2010/053558 | A2 | 5/2010 |
| WO | 2011/096368 | A1 | 8/2011 |

* cited by examiner (e)

(f)

(a)

(b)

(A) (B) (C)

(A) (B)

CURABLE RESIN COMPOSITION FOR SILICON-CONTAINING RESIST, PATTERN FORMING METHOD, METHOD FOR PRODUCING IMPRINT MOLD, AND METHOD FOR PRODUCING SEMICONDUCTOR DEVICE

TECHNICAL FIELD

The present disclosure relates to a curable resin composition for silicon-containing resist, a pattern forming method using thereof, a method for producing an imprint mold, and a method for producing a semiconductor device.

BACKGROUND ART

A device such as a semiconductor device is usually produced by a method of processing a workpiece substrate with dry etching, using a resist film with a pattern formed thereon, as an etching mask. In recent years, refinement of the pattern has been required. For example, a pattern width finer than 20 nm has been required. In order to prevent pattern collapse in the fine pattern, film thinning of a resist layer has been advanced. Meanwhile, along with the progress in film thinning of the resist layer, there have been tendencies such as deterioration in the cross-section shape of the resist layer, and enlargement of edge roughness (LWR). Along with the progress in the refinement of the resist pattern, deterioration in the shape of the resist pattern has become a problem due to the combination of the film thinning for preventing the collapse and, various effects caused by resist materials. Examples of the effects may include an effect due to dispersion of acid generated by exposure in a case of a chemically amplified resist, an effect due to a reflect electron in a case of an electron beam (EB) resist, and contraction along with curing in a case of a resist for nanoimprinting.

From this kind of circumstance, in the current refining process of a semiconductor, a reverse process may be used in order to form a highly precise fine pattern. In the reverse process, as shown in FIG. 5, hard mask layer 52 is formed on workpiece substrate 51, and a pattern configured by a conventional organic resist material is formed as core material pattern 53, on the hard mask layer 52 (FIG. 5(*a*)). Reversal layer 54 configured by a reversal layer material is formed on the core material pattern 53 (FIG. 5(*b*)). The core material pattern 53 is removed by etching, and reversal pattern 54*p* with higher etching resistance than that of the core material pattern, is formed (FIG. 5(*c*)). Hard mask pattern 52*p* is formed by an etching process of the hard mask layer 52 using the reversal pattern 54*p* as a mask (FIG. 5(*d*)). Pattern forming body 51 is obtained by an etching process of the workpiece substrate 51 using the hard mask pattern 52*p* as a mask (FIG. 5(*e*)). As a material for the reversal layer, materials such as a photocurable resin containing silicon with sufficiently large etching selectivity with the hard mask layer may be used (such as, in Patent Documents 1, 2). In this way, dry etching of the hard mask layer is possible by using the reversal pattern with higher etching resistance than that of the resist pattern configured by the conventional organic resist material, and selection of wide variety of etching gas is possible. Further, since the pattern is reversed when the core material pattern is formed, drawing area may be decreased in many cases when a fine pattern is drawn by a method such as an electron beam lithography, and the shortening of work period is possible.

In Patent Documents 1 and 2, methods for producing mold using the above described pattern forming method are described. Patent Document 2 describes that a photocurable material containing silicon as a reversal layer material is pasted on a resist pattern (core material pattern), and the reversal layer material is cured while pushing down a flat plate mold (flattening imprinting) to form a flat reversal layer.

CITATION LIST

Patent Documents

Patent Document 1: Japanese Patent No. 5144127
Patent Document 2: Japanese Patent Application Laid-Open (JP-A) No. 2018-98470

SUMMARY OF DISCLOSURE

Technical Problem

Conventionally, as a reversal layer material, generally, a material containing silicon, especially a material with siloxane skeleton is used in order to increase the etching selectivity. However, conventional material with siloxane skeleton has comparatively high viscosity, and further, the viscosity may be increased by the progress of curing reaction while in storage. For this reason, as shown in FIG. 5, when the reversal layer 54 is formed by pasting the reversal layer material on the concave and convex structure body 50 with concave and convex X on its surface, the concave part (gap of core material pattern 53) may not be sufficiently filled to generate babble B, and there is a problem that a defect may occur after curing (FIG. 5(*b*)). Also, dilution with a solvent may be considered to obtain coating performance, but there are problems such that the flatness is deteriorated by elution of the solvent to the surface during curing, and the curing defect occurs. If an etching mask with such a defect and bad flatness is used as an etching mask, highly precise fine pattern cannot be formed in the workpiece substrate. For this reason, a reversal layer material with excellent filling ability and flattening ability is required.

Also, there is a technique of forming a concave and convex shape with different height (depth) further to a workpiece substrate with concave and convex on its surface (concave and convex structure body). In this technique, a silicon-containing resist film is formed on the workpiece substrate with concave and convex on its surface so as to cover the concave and convex, and a pattern configured by an organic resist material is formed on the silicon-containing resist film. After that, an etching process of the silicon-containing resist film and the workpiece substrate is conducted by using the organic resist pattern as a mask. For this reason, in a silicon-containing resist film to be used for forming such a multi-stepped concave and convex structure, excellent filling ability and flattening ability with respect to the workpiece substrate with concave and convex on its surface are required.

The present disclosure has been made in view of the above circumstances, and a main object thereof is to provide a curable resin composition for silicon-containing resist with excellent filling ability and flattening ability.

Solution to Problem

The present disclosure provides a curable resin composition for silicon-containing resist comprising a polymerizable compound, and a polymerization initiator, wherein the polymerizable compound includes a siloxane bond in a molecule, and includes at least one polymerizable functional group; and a ratio of oxygen atoms bonded to a single silicon atom, among oxygen atoms bonded to a silicon atom included in the polymerizable compound, is 10 mol % or less, a viscosity of the curable resin composition for silicon-containing resist is cPs or less, and a solvent is not included therein.

The viscosity of the curable resin composition for silicon-containing resist in the present disclosure is the aforementioned value which is low viscosity. Also, when a ratio of oxygen atoms bonded to a single silicon atom, among oxygen atoms bonded to a silicon atom included in the polymerizable compound, is 10 mol % or less, increase of the viscosity is suppressed. For this reason, it can be pasted on the concave and convex structure body with good filling ability while preventing generation of babbles. Also, since a solvent is substantially not included, elution of the solvent to the surface can be suppressed in the curing step, and a cured layer with excellent flatness can be obtained. Further, silicon is included, and thus etching resistance to an oxygen gas and a chlorine gas is excellent.

In the disclosure, the polymerizable compound preferably includes a spherical structure. The polymerizable compound with a spherical structure allows the viscosity of the curable resin composition for silicon-containing resist to sufficiently decrease. Also, a cured layer with high heat stability can be obtained and heat deterioration during etching can be inhibited. Further, the molecule amount after curing may be uniformed, and processing uniformity (LER) can be improved.

In the disclosure, it is preferable that the polymerizable compound does not include an oxygen atom, a nitrogen atom, a phosphorus atom, or a sulfur atom between a silicon atom in a siloxane polymer portion configuring a main skeleton of the spherical structure, and the polymerizable functional group. The reason therefor is to improve the etching resistance.

In the disclosure, it is preferable that an etching rate ratio of a cured product of the curable resin composition for silicon-containing resist is: when a fluorine gas is used, 1.0 times or more with respect to a standard resist, when an oxygen gas is used, 0.2 times or less with respect to a standard resist, and when a chlorine gas is used, 2.0 times or less with respect to a metal chrome layer. With the above etching characteristics, highly precise fine pattern can be formed especially when the reverse process is used.

In the disclosure, it is preferable that a contact angle with respect to a surface of a standard resist shows 20° or less. The reason therefor is to improve wettability with respect to a resist configured by an organic material, and especially when the reverse process is used, it can be pasted in the gap of the core material pattern (convex part) with further excellent filling ability.

Further, the present disclosure provides a pattern forming method comprising a pasting step of pasting the aforementioned curable resin composition for silicon-containing resist, on a concave and convex structure body with a concave and convex on its surface so as to cover the concave and convex, wherein an etching process is performed in the concave and convex structure body using a cured layer of the curable resin composition for silicon-containing resist. The curable resin composition for silicon-containing resist of the present disclosure can be pasted with good filling ability in the concave part of the concave and convex structure body.

In the disclosure, the method preferably further comprises a flattening step of obtaining the cured layer by curing the curable resin composition for silicon-containing resist pasted on the concave and convex structure body in a state a flat plate mold is pushed against from upper side. With the curable resin composition for silicon-containing resist of the present disclosure, elution of the solvent to the surface can be suppressed in the flattening step, and a cured layer with excellent flatness can be obtained.

In the disclosure, it is preferable that the concave and convex structure body includes a workpiece substrate, a hard mask layer formed on the workpiece substrate, and a core material pattern formed on the hard mask layer and configured by an organic resist material; and the method comprises: a step of forming a reversal pattern of the core material pattern and supplementary the cured layer, by etching and removing the core material pattern after the flattening step; a step of forming a hard mask pattern by etching the hard mask layer using the reversal pattern as a mask; and a step of etching the workpiece substrate using the hard mask pattern as a mask. According to such a reverse process, highly precise fine pattern (such as in size 20 nm or less) can be formed in the workpiece substrate.

Also, in the disclosure, it is preferable that the concave and convex structure body is a workpiece substrate with a concave and convex on its surface, and the method further comprises, after the flattening step, a step of forming an organic resist pattern on the cured layer, and a step of etching processing of the cured layer and the workpiece substrate using the organic resist pattern as a mask. According to such a technique, highly precise multi-stepped concave and convex structure can be formed in the workpiece body.

The present disclosure provides a method for producing an imprint mold, wherein the imprint mold is produced by using the aforementioned pattern forming method.

The present disclosure provides a method for producing a semiconductor device, wherein the semiconductor device is produced by using the aforementioned pattern forming method.

Advantageous Effects of Disclosure

The present disclosure provides a curable resin composition for silicon-containing resist of which filling ability and flattening ability with respect to the convex and concave structure body are excellent.

DESCRIPTION OF EMBODIMENTS

Figure 1:
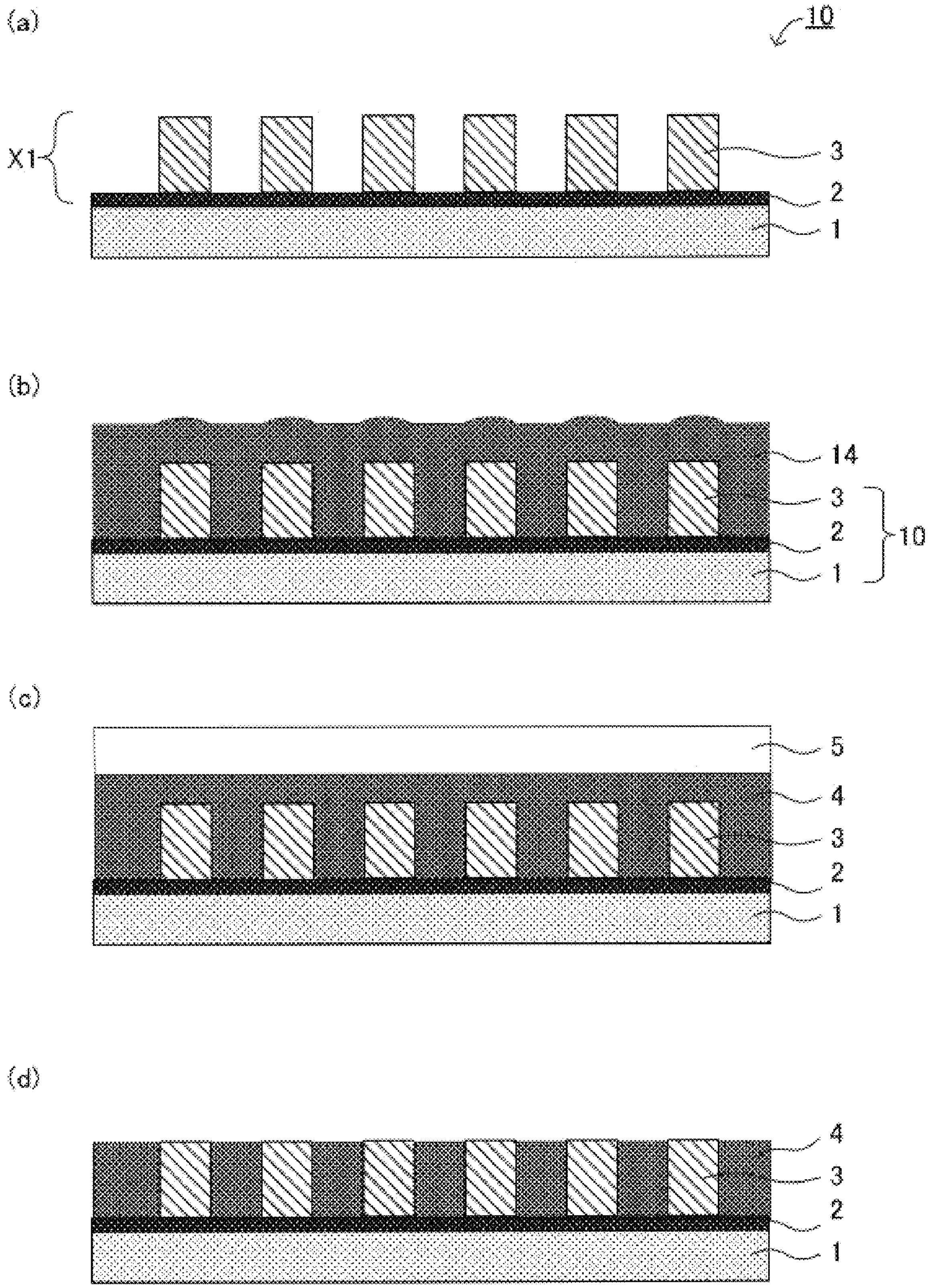
FIG. 1 (*a*) to (*d*) are schematic process drawings of the pattern forming method (first embodiment) using the curable resin composition for silicon-containing resist of the present disclosure.

An embodiment of the present disclosure is explained as below with reference to, for example, drawings. However, the present disclosure is enforceable in a variety of different forms, and thus should not be taken as is limited to the contents described in the embodiment exemplified as below. Also, the drawings may show the features of the invention such as width, thickness, and shape of each part schematically in order to explain the invention more clearly in some cases comparing to the actual form; however, it is merely an example, and thus does not limit the interpretation of the present disclosure. Also, in the present description and each drawing, for the factor same as that described in the figure already explained, the same reference sign is indicated and the explanation thereof may be omitted.

In the present description, upon expressing an embodiment of arranging one member on the other member, when it is expressed simply "on" or "below", both of when the other member is directly arranged on or below the one member so as to contact with each other, and when the other member is arranged above or below the one member interposing an additional member, can be included unless otherwise described. Furthermore, in the present description, upon expressing an embodiment of arranging one member in surfaces of the other member, when it is expressed simply "in the surface side" or "in the surface", both of when the other member is directly arranged on or below the one member so as to contact with each other, and when the other member is arranged above or below the one member interposing an additional member, can be included unless otherwise described.

Hereinafter, a curable resin composition for silicon-containing resist, a pattern forming method, a method for producing an imprint mold, and a method for producing a semiconductor device in the present disclosure will be described in detail.

A. Curable Resin Composition for Silicon-Containing Resist

As described above, as a reversal layer in the conventional reverse process, a material including a siloxane bond in a molecule has been used. In general, such a siloxane material has comparatively high viscosity. Also, in a polymer including a siloxane bond in a molecule, an oxygen atom is bonded to two silicon atoms. However, among the oxygen atoms, an oxygen atom bonded to a single silicon atom exist, for example, at the ends of the polymer. Such oxygen atoms usually constitute a highly reactive functional group with high reactivity, such as —OH or —OR (R represents an alkyl group with 1 to 4 carbons). The inventors of the present disclosure have newly found out that, since there is such a highly reactive functional group, the highly reactive functional group is reacted during storage of the curable resin composition for imprinting so that the molecular weight of the polymerizable compound is increased, and thereby the viscosity is increased.

They have also obtained a knowledge that such a highly reactive functional group included in the polymerizable compound chemically bonds to a constituent of the mold configured by a material such as quartz, and as a result, it becomes a stain difficult to be removed by cleaning.

The curable resin composition for silicon-containing resist in the present disclosure is characterized by comprising a polymerizable compound, and a polymerization initiator, wherein the polymerizable compound includes a siloxane bond in a molecule, and includes at least one polymerizable functional group, and a ratio of oxygen atoms bonded to a single silicon atom, among oxygen atoms bonded to a silicon atom included in the polymerizable compound, is 10 mol % or less, and a viscosity of the curable resin composition for silicon-containing resist is 20 cPs or less, and further a solvent is not included therein.

Figure 2:
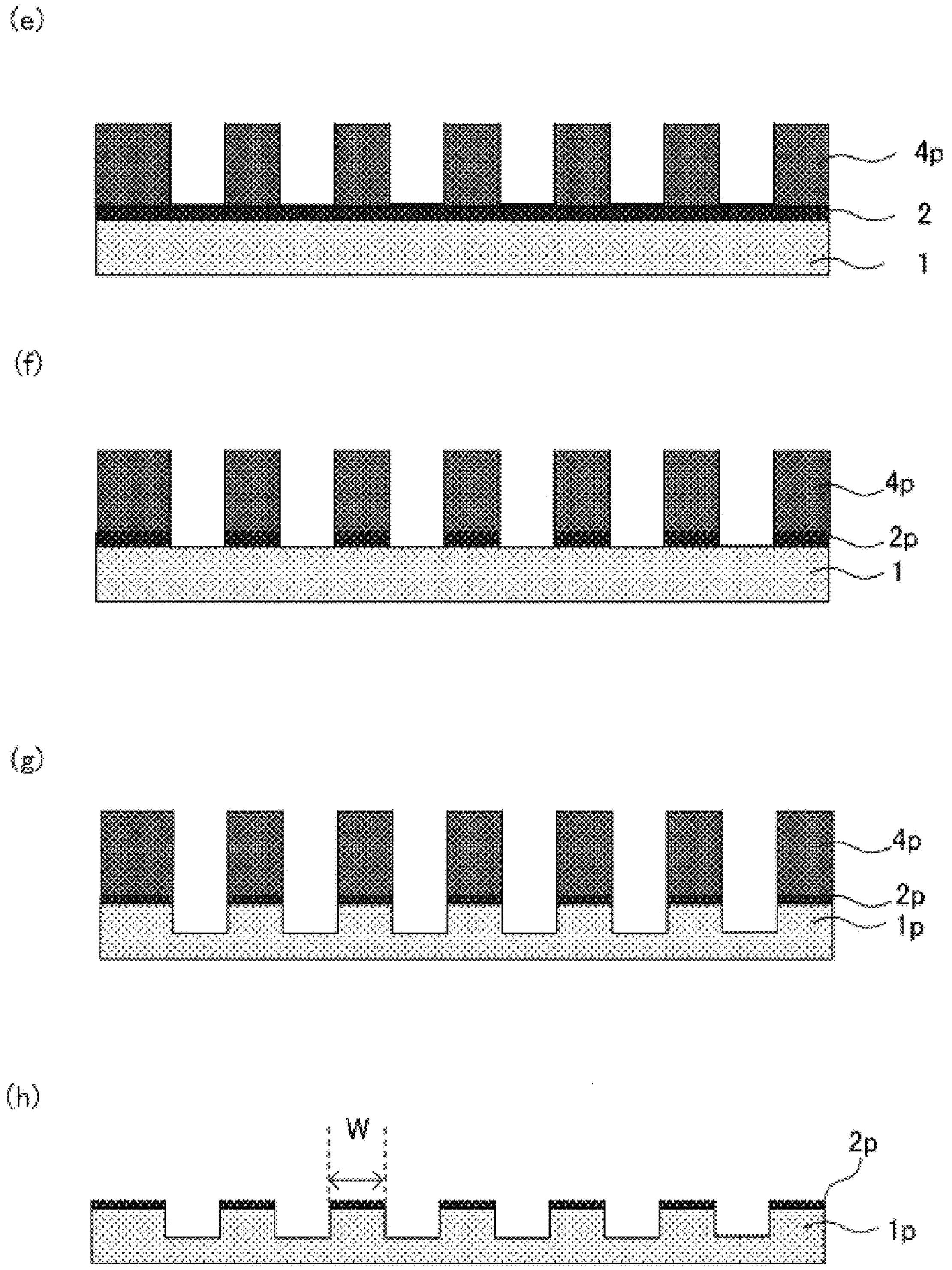
FIG. 2 (*e*) to (*h*) are schematic process drawings of the pattern forming method (first embodiment) using the curable resin composition for silicon-containing resist of the present disclosure.

FIG. 1 and FIG. 2 are schematic process drawings showing an example of a pattern forming method for forming a pattern in a workpiece substrate by a reverse process using the curable resin composition for silicon-containing resist in the present disclosure as a reversal layer material. As shown in FIG. 1, concave and convex structure body 10 including workpiece substrate 1, hard mask layer 2 formed on the workpiece substrate, and core material pattern 3 (convex part) configured by an organic resist material formed on the hard mask layer 2, is subjected to an etching process using the curable resin composition for silicon-containing resist as a reversal layer material, and thereby a pattern is formed in the workpiece substrate 1.

First, the curable resin composition for silicon-containing resist 14 of the present disclosure is pasted on the concave and convex structure body 10 including concave and convex X1 on its surface to cover the concave and convex X1 (FIG. 1 (*a*) (b), pasting step). Next, the cured layer (reversal layer) 4 is obtained by curing the curable resin composition for silicon-containing resist 14 pasted on the concave and convex structure body in a state flat plate mold is pushed against from upper side (FIG. 1 (*c*), flattening step). Next, after the flat plate mold 5 is peeled off, the cured layer 4 is etched so as to leave the cured layer 4 filled in the gap (concave part) of the core material pattern 3 (convex part) (FIG. 1 (*d*)). Next, the core material pattern 3 is removed by etching using the cured layer 4 filled in the concave part as a mask. Cured layer pattern (reversal pattern) 4*p* supplemental to the core material pattern is formed on the hard mask layer 2 by removing the core material pattern 3 (FIG. 2 (*e*)). Hard mask pattern 2*p* is formed by etching the hard mask layer using the cured layer pattern 4*p* as a mask (FIG. 2 (*f*)), and pattern formed body 1*p* is obtained by etching the workpiece substrate 1 using the hard mask pattern 2*p* as a mask (FIG. 2 (*g*), (*h*)).

The curable resin composition for silicon-containing resist in the present disclosure has low viscosity, and thus generation of babbles during pasting on the concave and convex structure body can be inhibited. Also, a solvent is substantially not included, and thus the elution of the solvent to the surface can be inhibited in the flattening step, and thereby a cured layer with excellent flatness can be obtained. Also, incomplete curing due to inclusion of the solvent can be inhibited. Further, the curable resin composition for silicon-containing resist in the present disclosure has excellent stability over time, and increase in viscosity while in storage can be suppressed. Also, reaction with the surface of the later described flat plate mold can also be suppressed, and thus detachability with respect to the flat plate mold is excellent.

In this manner, with the curable resin composition for silicon-containing resist in the present disclosure, a cured layer with excellent filling ability and flatness can be obtained. Further, silicon is included, and thus etching resistance to an oxygen gas and a chlorine gas is excellent. When such a cured layer is used as, for example, a reversal layer in a reverse process, highly precise fine pattern (such as in size 20 nm or less) can be formed in the workpiece substrate.

Hereinafter, the curable resin composition for silicon-containing resist in the present disclosure (hereinafter, sometimes simply referred to as a resin composition) will be described in detail.

1. Viscosity

The viscosity of the resin composition in the present disclosure is 20 cPs or less, preferably 10 cPs or less, and more preferably 7 cPs or less. Meanwhile, the lower limit is not particularly limited, and may be 1 cPs or more, and is preferably 1.5 cPs or more.

Such a resin composition in the present disclosure has extremely low viscosity, and thus can be pasted on the concave and convex structure body with excellent filling ability while suppressing generation of babbles. Also, with such a low viscosity, pasting by ink-jet method is possible. In addition, in the present invention, the viscosity of the resin composition is measured by dropping the resin composition onto a disk plate using an AR-G2 manufactured by TA Instruments in a measurement environment of 25° C. and 40% RH, and the value at 25° C. and 1000 (1/s) when the shear rate of a standard steel cone with a diameter of 40 mm is changed from 10 to 1000 (1/s), is used.

2. Polymerizable Compound

The polymerizable compound included in the resin composition in the present disclosure includes a siloxane bond in a molecule; includes at least one polymerizable functional group; and the ratio of oxygen atoms bonded to a single silicon atom, among oxygen atoms bonded to a silicon atom included in the polymerizable compound, is 10 mol % or less. As the polymerizable compound in the present disclosure, a polymer or oligomer including tetrafunctional silane, trifunctional silane, bifunctional silane, and monofunctional silane as a constituent unit may be used alone or in combination of a plurality of kinds.

In the present disclosure, it is preferable to use one including a trifunctional silane and a bifunctional silane mainly as a constituent unit, depending on desired properties for the resin composition, such as etching resistance and viscosity. Also, for the purpose of improving etching resistance, for example, a tetrafunctional silane may be included.

The polymerizable compound used in the present disclosure is characterized by a ratio of oxygen atoms bonded to a single silicon atom, among oxygen atoms bonded to a silicon atom included in the polymerizable compound, being 10 mol % or less, preferably 7 mol % or less, and particularly 5 mol % or less.

Here, an oxygen atom bonded to a single silicon atom means an oxygen atom wherein one hand among the two hands of an oxygen atom is bonded to silicon, and means not an oxygen atom wherein both of the two hands of an oxygen atom are bonded to a silicon atom. The other hand of the oxygen atom is not particularly limited as long as it is bonded to other than silicon, and is preferably bonded to a hydrogen, or an alkyl group with 1 to 4 carbons, in particular.

In the present disclosure, the ratio of the above described oxygen atoms bonded to a single silicon atom, that is, the ratio of highly reactive functional group, having a high reactivity such as —OH or —OR (R represents an alkyl group with 1 to 4 carbons), bonded to a silicon atom is in the above range. Thereby, stability over time of the resin composition may be improved, and increase of viscosity in storage can be suppressed. Also, for the same reason, since the reaction with the later described flat plate mold surface can be suppressed, detachability with respect to the flat plate mold becomes excellent.

The reason of the existence of the highly reactive functional group as described above in the polymerizable compound at a constant ratio is presumed to be an unreacted oxygen atom remaining in the process of producing the polymerizable compound.

As a reason for such unreacted oxygen atoms remaining, in the case of —OR (R represents an alkyl group with 1 to 4 carbons), the hydrolysis of the alkoxy group of the raw material not being proceeded is considered to be a cause, and in the case of —OH, the polymerization reaction not being proceeded completely due to, for example, steric hindrance is considered to be a cause.

In the present disclosure, the ratio of oxygen atoms bonded to a single silicon atom indicates the number of oxygen atoms bonded to a single silicon atom, when the number of oxygen atoms bonded to a silicon atom in the polymerizable compound is regarded as 100.

As for the method for measuring this ratio, the ratio may be calculated by analyzing the spectrum with $^{29}$Si NMR.

Specifically, when a composition including a siloxane structure including a trifunctional silane as a constituent unit is analyzed with NMR, the following four peaks are observed: component $T^0$ wherein none of the three oxygen atoms bonded to the silicon atom is bonded to other silicon atom; component $T^1$ wherein one of the three oxygen atoms bonded to the silicon atom is bonded to other silicon atom; component $T^2$ wherein two of the three oxygen atoms bonded to the silicon atom are bonded to other silicon atom; and component $T^3$ wherein all of the three oxygen atoms bonded to the silicon atom are bonded to other silicon atom.

The value obtained by integrating these four peaks ($T^0$-$T^3$), that is, when the ratio of each area is regarded as $T^0$-$T^3$, the ratio (mol %) of the oxygen atoms bonded to a single silicon atom may be calculated from the following equation (1).

$$(T^0\times3+T^1\times2+T^2\times1+T^3\times0)/((T^0+T^1+T^2+T^3)\times3)\times100 \quad (1)$$

Also, when a siloxane structure including a bifunctional silane as a constituent unit is included in the composition, the following three peaks are observed: a component wherein all of the two oxygen atoms bonded to the silicon atom are not bonded to other silicon atom; a component wherein one of the two oxygen atoms bonded to the silicon atom is bonded to other silicon atom; and a component wherein all of the two oxygen atoms bonded to the silicon atom are bonded to other silicon atom.

The value obtained by integrating these three peaks, that is, when the ratio of each area is regarded as $D^0$-$D^2$, the ratio (mol %) of the oxygen atoms bonded to a single silicon atom may be calculated from the following equation (2).

$$(D^0\times2+D^1\times1+D^2\times0)/((D^0+D^1+D^2)\times2)\times100 \quad (2)$$

Further, when a siloxane structure including a tetrafunctional silane as a constituent unit is included in the composition, the following five peaks are observed: a component wherein all of the four oxygen atoms bonded to the silicon atom are not bonded to other silicon atom; a component wherein one of the four oxygen atoms bonded to the silicon atom is bonded to other silicon atom; a component wherein two of the four oxygen atoms bonded to the silicon atom are bonded to other silicon atom; a component wherein three of the four oxygen atoms bonded to the silicon atom are bonded to other silicon atom; and a component wherein all of the four oxygen atoms bonded to the silicon atom are bonded to other silicon atom.

The value obtained by integrating these five peaks, that is, when the ratio of each area is regarded as $Q^0$-$Q^4$, the ratio (mol %) of the oxygen atoms bonded to a single silicon atom may be calculated from the following equation (3).

$$(Q^0\times4+Q^1\times3+Q^2\times2+Q^3\times1+Q^4\times0)/((Q^0+Q^1+Q^2+Q^3+Q^4)\times4)\times100 \quad (3)$$

For example, when the polymerizable compound, including two types of trifunctional silane and bifunctional silane as constituent units, is included in the resin composition, the value is calculated by;

$$((T^0\times3+T^1\times2+T^2\times1+T^3\times0)+(D^0\times2+D^1\times1+D^2\times0))/((T^0+T^1+T^2+T^3)\times3+(D^0+D^1+D^2)\times2)\times100.$$

The value, calculated by carrying out to the resin composition in the present disclosure, is used for the spectrum analysis by the $^{29}$Si NMR.

The weight average molecular weight of the polymerizable compound is preferably in a range of 500 to 100000, and particularly preferably in a range of 600 to 50000, and among them, preferably in a range of 700 to 20000.

The weight average molecular weight (Mw) is a molecular weight measured by gel permeation chromatography (GPC), calculated relative to polystyrene standards, and is a value measured under the following conditions, after pressure filtration through a membrane filter having a filter pore diameter of 0.2 μm.

(Conditions)

Device: Water 2695

Sample volume: approximately 10 mg of sample per 3 mL of solvent

Injection volume: 5 μL

Guard Column: LF-G (Shodex)

Column: GPC LF-804×3 columns (Shodex)

Column temperature: 40° C.

Mobile phase: tetrahydrofuran

Flow rate: 1.0 mL/min

Detector: Differential Refractometer (Water 2414)

Molecular weight calibration: calculated relative to polystyrene standards

The polymerizable functional group included in the polymerizable compound is not particularly limited as long as it is a functional group capable of carrying out a polymerization reaction and the polymerization reaction proceeds by stimulus from the outside, and for example, an acryloyl group, a methacryloyl group, an acryloyloxy group, a methacryloyloxy group, an epoxy group, an oxetane group, and a vinyl ether group wherein a polymerization reaction is proceeded by, for example, light irradiation, heat, heat accompanying light irradiation, and function of a photo-acid generator may be used. This is because, if such a polymerizable functional group is used, stability during synthesis and storage and reactivity during curing are good, and further, the raw material is easily available.

In the present disclosure, acryloyl groups and methacryloyl groups are particularly preferable in view of curing rate and the wide range of physical property selectivity.

When the polymerizable group directly linked to the silicon atom in the polymerizable compound is bulky, the molecular weight of the polymerizable group directly linked to the silicon atom is preferably in a range of 20 to 500, and among them, in a range of 25 to 400, taking into consideration that the reactivity may be changed due to steric hindrance, and may affect curability. Incidentally, in the present disclosure, a polymerizable group refers to a group including a polymerizable functional group.

As such a polymerizable group, preferred examples thereof may include structures shown below.

[Chemical 1]

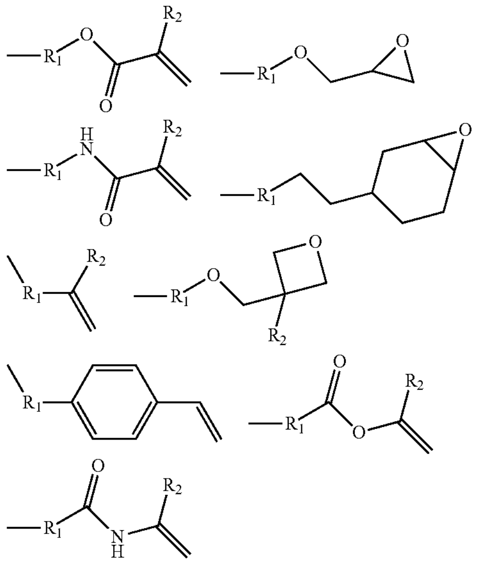

(Here, $R_1$ means a substituted or unsubstituted alkyl chain with 1 to 10 carbons, $R_2$ means a substituted or unsubstituted alkyl chain with 1 to 3 carbons, or a hydrogen atom; both $R_1$, and $R_2$ may be straight or branched.)

At least one polymerizable functional group may be bonded to the constituent unit of the polymerizable compound. However, it is not limited thereto, and two or more of them may be bonded.

Preferable examples of the constituent unit including a polymerizable group in the polymerizable compound used in the present disclosure may include the followings.

Firstly, examples of a trifunctional constituent unit may include 3-acryloxypropyltrimethoxysilane, 3-acryloxypropyltriethoxysilane, 3-methacryloxypropyltrimethoxysilane, 3-methacryloxypropyltriethoxysilane, vinyltrimethoxysilane, vinyltriethoxysilane, allyltrimethoxysilane, allyltriethoxysilane, styryltrimethoxysilane, styryltriethoxysilane, 3-glycidoxypropyltrimethoxysilane, 3-glycidoxypropyltriethoxysilane, 2-(3,4-epoxycyclohexyl)ethyltrimethoxysilane, 2-(3,4-epoxycyclohexyl)ethyltriethoxysilane, 3-ethyl-3-[3'-(trimethoxysilyl)propyl]methyloxetane, and 3-ethyl-3-[3'-(triethoxysilyl)propyl]methyloxetane. Among them, for example, 3-acryloxypropyltrimethoxysilane, 3-acryloxypropyltriethoxysilane, 3-methacryloxypropyltrimethoxysilane, 3-methacryloxypropyltrimethoxysilane, 3-methacryloxypropyltriethoxysilane, vinyltrimethoxysilane, vinyltriethoxysilane, 3-glycidoxypropyltrimethoxysilane, 3-glycidoxypropyltriethoxysilane, 2-(3,4-epoxycyclohexyl)ethyltrimethoxysilane, 2-(3,4-epoxycyclohexyl)ethyltriethoxysilane, 3-ethyl-3-[3'-(trimethoxysilyl)propyl]methyloxetane, and 3-ethyl-3-[3'-(triethoxysilyl)propylmethyloxetane may be preferably used.

Also, examples of a bifunctional constituent unit may include 3-acryloxypropyl (methyl) dimethoxysilane, 3-acryloxypropyl (methyl) diethoxysilane, 3-methacryloxypropyl (methyl) dimethoxysilane, 3-methacryloxypropyl (methyl) diethoxysilane, vinyl (methyl)dimethoxysilane, vinyl (methyl)diethoxysilane, allyl (methyl)dimethoxysilane, allyl (methyl)diethoxysilane, styryl (methyl) dimethoxysilane, styryl (methyl) diethoxysilane, 3-glycidoxypropylmethyldietoxysilane, 3-glycidoxypropylmethyldimetoxysilane, 2-(3,4-epoxy cyclohexyl)ethyl(methyl)dimethoxysilane, 2-(3,4-epoxy cyclohexyl)ethyl(methyl)diethoxysilane), 3-ethyl-3-[3'-(methyldimethoxysilyl)propyl]methyloxetane, 3-ethyl-3-[3'-(methyldiethoxysilyl)propyl]methyloxetane, dimethoxymethyl vinylsilane, and diethoxymethyl vinylsilane. Among them, 3-acryloxypropyl (methyl)dimethoxysilane, 3-acryloxypropyl (methyl) diethoxysilane, 3-methacryloxypropyl (methyl) dimethoxysilane, 3-methacryloxypropyl (methyl)diethoxysilane, vinyl (methyl)dimethoxysilane, vinyl (methyl) diethoxysilane, 3-glycidoxypropylmethyldietoxysilane, 3-glycidoxypropylmethyldimetoxysilane, 2-(3,4-epoxy cyclohexyl)ethyl(methyl) dimethoxysilane, 2-(3,4-epoxy cyclohexyl)ethyl(methyl) diethoxysilane, 3-ethyl-3-[3'-(methyldimethoxysilyl) propyl]methyloxetane, and 3-ethyl-3-[3'-(methyldiethoxysilyl)propyl]methyloxetane may be preferably used.

Also, a constituent unit including no polymerizable group may be used in combination with the constituent unit including a polymerizable group. Examples of a trifunctional constituent unit including no polymerizable group may include trimethoxy(methyl)silane, triethoxy(methyl)silane, methyltripropoxysilane, tributoxy(methyl)silane, methyltriphenoxysilane, ethyltrimethoxysilane, triethoxy (ethyl)silane, ethyltripropoxysilane, tributoxy (ethyl)silane, ethyltriphenoxysilane, trimethoxy(propyl)silane, triethoxy (propyl)silane, tripropoxy(propyl)silane, tributoxy(propyl) silane, triphenoxy(propyl)silane, butyltrimethoxysilane, butyltriethoxysilane, butyltripropoxysilane, tributoxy(butyl) silane, butyltriphenoxysilane, trimethoxy(phenyl)silane, triethoxy(phenyl)silane, phenyltripropoxysilane, tributoxy (phenyl)silane, triphenoxy(phenyl)silane, cyclohexyltrimethoxysilane, cyclohexyltriethoxysilane, cyclohexyltriproxysilane, cyclohexyltributoxysilane, and cyclohexyltriphenoxysilane. Among them, trimethoxy(methyl)silane, triethoxy(methyl)silane, ethyltrimethoxysilane, triethoxy(ethyl)silane, trimethoxy(phenyl)silane, triethoxy (phenyl)silane, cyclohexyltrimethoxysilane, and cyclohexyltriethoxysilane may be preferably used.

Also, examples of a bifunctional constituent unit may include dimethoxydimethylsilane, diethoxydimethylsilane, methylphenyldimethoxysilane, methylphenyldiethoxysilane, cyclohexyl (dimethoxy) methylsilane, cyclohexyldiethoxymethylsilane, dimethoxydiphenylsilane, diethoxydiphenylsilane, dimethoxymethylvinylsilane, and diethoxymethylvinylsilane.

In the polymerizable compound in the present disclosure, the content of silicon atoms in the polymerizable compound is, preferably 15 mass % or more, and particularly preferably 20 mass % or more. With such a content of silicon atoms, etching resistance to an oxygen gas and a chlorine gas becomes more excellent, and excellent etching properties can be obtained.

As described above, the structure of the polymerizable compound in the present disclosure is not limited as long as it includes a siloxane bond in a molecule; includes at least one polymerizable functional group; and the ratio of oxygen atoms bonded to a single silicon atom, among oxygen atoms bonded to a silicon atom included in the polymerizable compound, is mol % or less. However, the later described (a) polymerizable compound with a spherical structure, and (b) polyhedral siloxane oligomer with an incompletely condensed skeleton, are preferable, since the viscosity of the resin composition substantially not including the solvent such as the one in the present disclosure can be sufficiently decreased. Especially, (a) polymerizable compound with a spherical structure is preferable from the viewpoint of heat stability and uniform processability.

(a) Polymerizable Compound with a Spherical Structure

The spherical structure is a structure in which a polymerizable functional group stretches outward, centering a polymer portion with high degree of condensation. For example, with the polymerizable compound with a spherical structure such as dendrimer, a ratio of oxygen atoms bonded to a single silicon atom, among oxygen atoms bonded to a silicon atom included in the polymerizable compound, is 10 mol % or less; and the viscosity of the resin composition can be sufficiently decreased. Also, the polymerizable compound with a spherical structure has high heat stability, and thus deterioration during etching can be inhibited. Further, the spherical structure allows the molecular weight after curing to be uniform, and uniform processability and LER can be improved.

Examples of the polymerizable compound with the spherical structure may include those including a trifunctional silane as a constituent unit. Among them, those including only the trifunctional silane as a constituent unit are preferable. Examples of the polymerizable compound including such a spherical structure may include one kind or a mixture of two kinds or more of 6 mers to 36 mers (molecular weight of 1000 or more and 6300 or less) of a trifunctional silane including a polymerizable functional group. Incidentally, the molecular weight of the polymerizable compound with the spherical structure may be, in a range of 2000 or more and 6000 or less, and preferably in a range of 2000 or more and 3000 or less.

The siloxane including a trifunctional silane usually includes a structure wherein the polymerizable functional group stretches outward, centering a siloxane polymer portion with high degree of siloxane condensation including $SiO_{3/2}$ unit. Since the degree of siloxane condensation in the siloxane polymer portion, of the polymerizable compound including such a spherical structure is higher than 90%, particularly, it may be 95% or more, and furthermore, it may be 97% or more, the ratio of oxygen atoms bonded to a single silicon atom, among oxygen atoms bonded to a silicon atom included in the polymerizable compound, will be 10 mol % or less.

The reason therefor is presumed as follows. That is, when the trifunctional silane is hydrolyzed under a basic condition, a $OH^-$ nucleophilic reaction occurs with respect to the Si atom. The hydrolysis reaction rate increases since the steric hindrance of the Si atom decreases due to the hydrolysis of one hydrolyzable group (alkoxy group), so that $—Si(OH)_3$ wherein all of the three hydrolyzable groups (alkoxy group) are hydrolyzed, is produced. Since all of the OH groups of the $—Si(OH)_3$ are capable of condensation polymerization, a siloxane structure with high density and high degree of condensation is formed three-dimensionally.

Specifically, it includes the spherical structure represented by the following formulas. Incidentally, the following formulas are diagrams respectively showing a polymerizable compound including the spherical structure including a 8 mer of a trifunctional silane including an acryloxypropyl group and a 3-methacryloxypropyl group as polymerizable groups.

[Chemical 2]

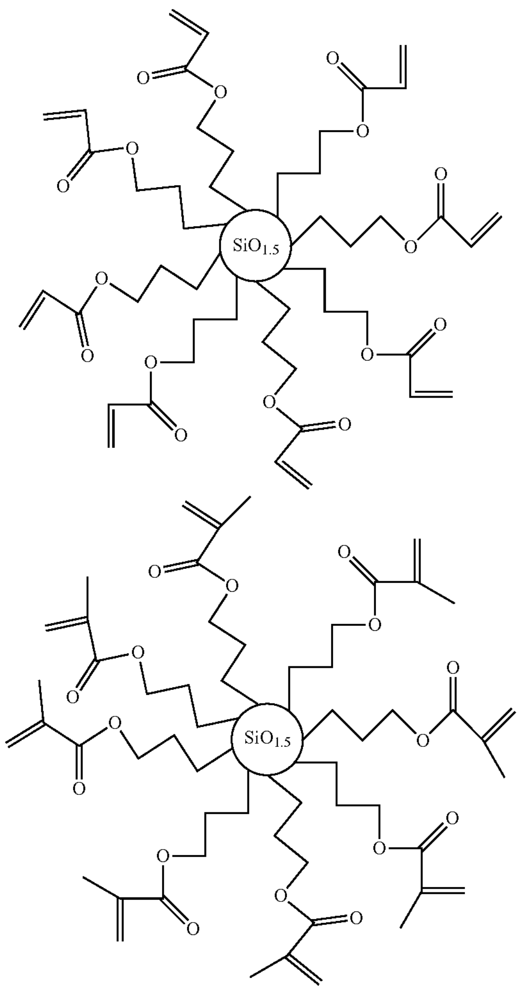

(Wherein $SiO_{1.5}$ represents a siloxane polymer portion including $SiO_{3/2}$ unit.)

In the present disclosure, as the polymerizable compound with the spherical structure, those not including an oxygen atom, a nitrogen atom, a phosphorus atom, or a sulfur atom in a linking group between a siloxane polymer portion configuring a main skeleton of the spherical structure, and the polymerizable functional group, preferably between a silicon atom in the siloxane polymer portion (such as a silicon atom in $SiO_{3/2}$ unit) configuring a main skeleton of the spherical structure, and the polymerizable functional group, are preferable. When an oxygen atom, a nitrogen atom, a phosphorus atom, and a sulfur atom are included in such a place, etching can be easily done with an oxygen gas and a chlorine gas to be used during dry etching. With those not including an oxygen atom, a nitrogen atom, a phosphorus atom and a sulfur atom, sufficient selectivity can be obtained among organic resist materials and hard mask layer (such as a metal chrome) during dry etching by an oxygen gas or a chlorine gas.

Examples of the linking group between the silicon atom in the siloxane polymer portion, and the polymerizable functional group may include, a divalent hydrocarbon group not including an oxygen atom, a nitrogen atom, a phosphorus atom, and a sulfur atom, and a straight chain alkylene group is preferable, and $-(Ch_2)_n-$ (n is an integer of 1 to 9) is more preferable.

The polymerizable compound with the spherical structure can be obtained by subjecting a hydrolyzable silane composition including at least a hydrolyzable silane, to a hydrolysis condensation reaction under a basic condition.

Specifically, it may be carried out by charging a solvent and a silane as a raw material into a reactor, adding a basic substance as a catalyst, and adding water dropwise while stirring. Examples of basic catalysts may include sodium hydroxide, potassium hydroxide, lithium hydroxide, potassium carbonate ($K_2CO_3$), sodium carbonate, and ammonia, PH may be 8 to 13, and typically may be carried out at room temperature to 100° C.

The silane as the raw material may be anyone kind or more of quatrofunctional hydrolyzable silane, trifunctional hydrolyzable silane, bifunctional hydrolyzable silane, and monofunctional hydrolyzable silane. It is preferable to use a quatrofunctional hydrolyzable silane or trifunctional hydrolyzable silane. It is particularly preferable to use a trifunctional hydrolyzable silane. Also, only one kind of hydrolyzable silane may be used, and two kinds or more thereof may be used in combination.

As described above, by using the basic catalyst as the catalyst in the synthesizing step, the degree of condensation of the polymerizable compound obtained in the hydrolysis condensation reaction will be high. Therefore, a polymerizable compound with the spherical structure wherein the ratio of oxygen atoms bonded to a single silicon atom, among the oxygen atoms bonded to the silicon atom, is reduced, particularly, reduced to 10 mol % or less, may be easily obtained.

(b) Polyhedral Siloxane Oligomer with Incompletely Condensed Skeleton

Also, in the disclosure, the polymerizable compound is preferably a polyhedral siloxane oligomer with an incompletely condensed skeleton. Since such the polymerizable compound includes a regular structure, the ratio of oxygen atoms bonded to a single silicon atom, among oxygen atoms bonded to a silicon atom included in the polymerizable compound, will be 10 mol % or less. Also, the viscosity of the resin composition can be sufficiently decreased.

Examples of the polyhedral siloxane oligomer with an incompletely condensed skeleton to which the polymerizable functional group is bonded, may include an incompletely condensed type wherein one apex, one side, or one surface is missing in a polyhedral siloxane oligomer with a completely condensed skeleton. The polyhedral siloxane oligomer including an incompletely condensed skeleton is particularly preferably the one represented by the following formula.

[Chemical 3]

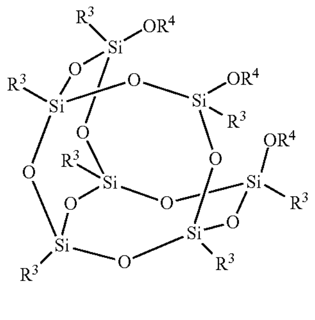

-continued

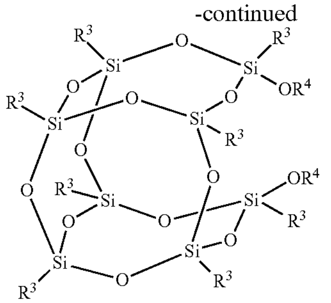

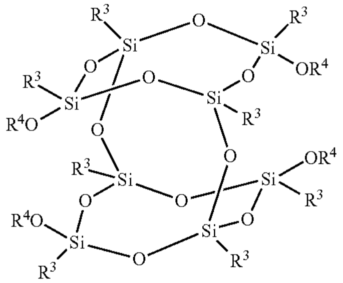

(Wherein $R^3$ is a monovalent hydocarbon group, and $R^4$ is a —Si-polymerizable group, a hydrogen atom, a metal ion such as Na, and Li, or a tetraalkylammonium ion (as the alkyl group, for example, methyl, ethyl, propyl, and butyl) bonded to an oxygen atom in the formula.)

$R^3$ is a one valent hydrocarbon group, and preferably an alkyl group with 1 to 5 carbons, and a phenyl group, and specifically, an ethyl group, a butyl group, and a phenyl group.

The polymerizable compound can be obtained by reacting a polymerizable functional group-containing compound, with a polyhedral siloxane oligomer including an incompletely condensed skeleton to which a hydrogen atom, a hydroxy group or an organic group other than the polymerizable functional group is bonded to a silicon atom.

A polyhedral siloxane oligomer with an incompletely condensed skeleton, as a raw material is one wherein a hydrogen atom, a hydroxy group, or an organic group other than the polymerizable functional group is bonded to a silicon atom located at an apex.

Examples of the organic group other than the polymerizable functional group may include an alkoxy group, an alkyl group, and a phenyl group.

Examples of the reaction of the raw material with the polymerizable functional group containing compound may include conventionally known reactions. Examples thereof may include an addition reaction of a hydrogen atom directly bonded to silicon and a polymerizable functional group containing compound including an unsaturated double bond; and a reaction of an OH group or an OR group directly bonded to silicon and a polymerizable functional group containing compound capable of forming a siloxane bond.

The content of the polymerizable compound in the resin composition is not particularly limited, but from the viewpoint of allowing the resin composition to have the viscosity of the above described value or less, in the resin composition, it is preferably more than 0 mass % and 50 mass % or less, and particularly preferably 10 mass % or more and 30 mass % or less.

3. Polymerization Initiator

The resin composition in the present disclosure includes a polymerization initiator. Examples of the polymerization initiator may include a photopolymerization initiator and a heat polymerization initiator, but the photopolymerization initiator is particularly preferable.

The photopolymerization initiator is a substance that generates a reactive species causing a polymerization reaction of a polymerizable compound by light stimulus. Specific examples thereof may include a photoradical generator wherein radicals are generated by light stimulus, and a photoacid generator wherein protons are generated by light stimulus. The photoradical generator is a polymerization initiator which generates radicals by light (charged particle radiation such as infrared rays, visible rays, ultraviolet rays, far ultraviolet rays, X-rays, and electron beams; and radioactive rays), and is mainly used when the polymerizable compound is a radical polymerizable compound. Meanwhile, the photoacid generator is a polymerization initiator which generates an acid (proton) by light, and is mainly used when the polymerizable compound is a cation polymerizable compound.

Examples of the photoradical generator may include 2,4,6-trimethyldiphenylphosphine oxide, 2,2-dimethoxy-2-phenylacetophenone, 2-methyl-1-[4-(methylthio)phenyl]-2-morpholino-propane-1-one, 2-benzilic-2-dimethylamino-1-(4-morpholinophenyl)-1-butanone, 2-(dimethylamino)-2-[(4-methylphenyl)methyl]-1-[4-(4-morpholinyl)phenyl]-1-butanone, 2-hydroxy-2-methyl-1-phenyl-propan-1-one, and 2-hydroxy-2-methyl-1-phenyl-propan-1-one, although not limited thereto. Incidentally, one kind of these photoradical generator may be used alone, and two kinds or more thereof may be used in combination.

Examples of the photoacid generator may include an onium salt compound, a sulfone compound, a sulfonic acid ester compound, a sulfonimide compound, and a diazomethane compound, although not limited thereto.

Examples of the heat polymerization initiator may include a compound that generates the polymerization factor (such as radicals and cations) by heat. Specific examples of the heat polymerization initiator may include a heat radical generator that generates radicals by heat, and a heat acid generator that generates protons ($H^+$) by heat. The heat radical generator is mainly used when the polymerizable compound is a radical polymerizable compound. Meanwhile, the heat acid generator is mainly used when the polymerizable compound is a cation polymerizable compound.

Examples of the heat radical generator may include an organic peroxide and an azo-based compound. Examples of the organic peroxide may include peroxyesters such as t-hexylperoxyisopropylmonocarbonate, t-hexylperoxy-2-ethylhexanoate, t-butylperoxy-3,5,5-trimethylhexanoate, t-butylperoxyisopropylcarbonate; peroxyketals such as 1,1-bis(t-hexylperoxy)3,3,5-trimethylsiclohexane; and diacylperoxides such as lauroylperoxide; however, not limited thereto. Also, examples of the azo-based compound may include azonitriles such as 2,2'-azobisisobutylonitril, 2,2'-azobis(2-methylbutylonitril), and 1,1'-azobis(siclohexane-1-carbonitril); however, not limited thereto.

Examples of the heat acid generator may include known iodonium salt, sulfonium salt, phosphonium salt, and ferrocenes. Specific examples thereof may include diphenyliodoniumhexafluoroantimonate, diphenyliodoniumhexafluorophosphate, diphenyliodoniumhexafluoroborate, triphenylsulphoniumhexafluoroantimonate, triphenylsulphoniumhexafluorophosphate, and triphenylsulfoniumhexafluoroborate; however, not limited thereto.

The content of the polymerization initiator in the resin composition in the present disclosure is not particularly limited, and may be in a range of 0.5 mass % to 20 mass %, and may be in a range of 1 mass % to 10 mass %, based on the polymerizable compound.

4. Solvent

The resin composition in the present disclosure substantially does not include a solvent. By substantially not including the solvent, deterioration of flatness due to the elution of the solvent during curing, and incomplete curing can be inhibited.

Here, “substantially not including the solvent” does not mean a solvent such as impurities not intended to be included, but means the solvent other than that. In other words, for example, the content of the solvent of the resin composition in the present disclosure is, with respect to the whole resin composition, preferably 0.01 mass % or less, and more preferably mass % or less. Incidentally, the solvent here refers to a solvent generally used in a curable composition and a photoresist. In other words, there are no particular limitations on the kind of the solvent as long as it allows the compound used in the present invention to be dissolved and uniformly dispersed, and not reacting with the said compound.

5. Optional Components (1) Reactive Crosslinking Agent

The resin composition of the present disclosure may further include a reactive crosslinking agent. Examples of the reactive crosslinking agent may include those including a polymerizable functional group, and those including two or more of the polymerizable functional group. Examples of the polymerizable functional group may include an ethylene unsaturated bond-containing group, and an epoxy group, but the ethylene unsaturated bond-containing group is preferable. Examples of the ethylene unsaturated bond-containing group may include a (meth)acryl group, and a vinyl group, but the (meth)acryl group is more preferable, and an acryl group is further preferable. Also, the (meth)acryl group is preferably a (meth)acryloyloxy group. In one molecule, two kinds or more of the polymerizable group may be included, and two or more of the polymerizable group of the same kind may be included.

Examples of the photopolymerizable monomer including two polymerizable functional groups (bifunctional monomer) may include trimethylolpropanedi(meth)acrylate, ethyleneglycoldi(meth)acrylate, tetraethyleneglycoldi(meth) acrylate, polyethyleneglycoldi(meth)acrylate, polypropyleneglycoldi(meth)acrylate, 1,4-butanedioldi (meth)acrylate, 1,6-hexanedioldi(meth)acrylate, neopentylglycoldi(meth)acrylate, and bis(hydroxymethyl)tricyclodecanedi(meth)acrylate. Examples of commercial products of the said bifunctional monomer may include light acrylate 3EG-A, 4EG-A, 9EG-A, NP-A, DCP-A, BP-4EAL, and BP-4PA (all from KYOEISHA CHEMICAL Co., LTD.).

Also, from the viewpoint of compatibility, a polyfunctional monomer with a siloxane structure is preferable.

The content of the reactive crosslinking agent is not particularly limited, and may be in a range of 0 mass % to 99 mass %, and is preferably in a range of 5 mass % to 80 mass %, in the resin composition of the present disclosure.

(2) Others

The resin composition of the present disclosure may include an optional component other than the polymerizable compound, the polymerization initiator, and the reactive crosslinking agent described above. Examples of the optional component may include components such as a surfactant, a mold release agent, a silane coupling agent, a photosensitizer, an antioxidant, an organic metal coupling agent, a polymerization inhibitor, an ultraviolet absorber, a photostabilizer, an age resister, a plasticizer, an adhesion promoter, a photobase generator, a colorant, an elastomer particle, a photo acid multiplication agent, a basic compound, as required, and other components such as a fluidity modifier, an anti-foaming agent, and a dispersant. In order to obtain excellent etching characteristics, components other than the above described polymerizable compound, polymerization initiator and reactive crosslinking agent are preferably not included, but even when other components are included, the content of the other component is preferably 5 mass % or less, and particularly preferably 3 mass % or less in the resin composition of the present disclosure.

6. Other Physical Properties (1) Wettability

In the resin composition of the present disclosure, a contact angle with respect to a surface of a standard resist preferably shows 20° or less, and more preferably shows 15° or less. In the present disclosure, in specific, the contact angle can be measured by dropping the resin composition of the present disclosure onto the surface of the standard resist layer under a normal pressure atmosphere with a temperature of 25° C. and a humidity of 33%, and then measuring with a contact angle measurement device (automatic contact angle meter DM-501 from Kyowa Interface Science Co., Ltd.) in 5 seconds.

In the present disclosure, the standard resist layer is one formed with an acryl-styrene copolymer (organic resist resin) as a base resin.

When the contact angle with respect to the standard resist layer is as described above, for example, when used as the reversal layer material in the reverse process, wettability to the core material pattern formed from the resist composition will be excellent, and thus can be pasted with more excellent filling ability. When the resin composition of the present disclosure shows the above described contact angle to the standard resist, it exhibits excellent wettability even when the composition of the standard resist differs from the composition of the organic resist material actually used as the core material pattern.

(2) Etching Properties

In the reverse process as shown in FIG. 1, there are etching steps of cured layer 4, core material pattern 3, hard mask layer 2, and workpiece substrate 1. Among these, etching relating to the cured layer is etching of the cured layer, the core material pattern, and the hard mask layer, and different etching gases are respectively used. For example, a fluorine gas is used for etching of the cured layer, an oxygen gas is used for etching of the core material pattern, and a chlorine gas is used for etching of the hard mask layer, respectively as the etching gas.

An etching rate ratio (cured product/standard resist) of the cared product (cured layer) of the resin composition in the present disclosure is, when a fluorine gas is used, preferably 1.0 times or more with respect to a standard resist. Also, when an oxygen gas is used, the etching rate ratio (cured product/standard resist) is preferably 0.2 times or less with respect to a standard resist. Further, when a chlorine gas is used, the etching rate ratio (cured product/metal chrome) is preferably 2.0 times or less with respect to a metal chrome layer.

With such a etching rate ratio, in the reverse process, excellent etching resistance will be exhibited during etching of the core material pattern (organic resist material) and the hard mask layer (such as a metal chrome layer), and will also exhibit sufficiently high etching rate to the core material pattern during etching of the cured layer. For this reason, highly precise fine pattern can be formed when used in the reverse process.

The above described etching rate ratios are the values calculated from the etching depth of the cured layer, the standard resist layer, and the metal chrome layer in the below etching conditions. Incidentally, the standard resist is the one same as "6. Other physical properties (1) Wettability" described above.

(Fluorine Gas Etching Conditions)

$CF_4$ gas flow amount: 30 sccm, He gas flow amount: 70 sccm

ICP power: 300 W, RIE power: 100 W, Pressure: 1.0 Pa (Oxygen gas etching conditions)

$O_2$ gas flow amount: 100 sccm

ICP Power: 100 W, RIE power: 50 W, Pressure: 1.0 Pa (Chlorine Gas Etching Conditions)

$Cl_2$ gas flow amount: 30 sccm, He gas flow amount: 70 sccm

ICP power: 300 W, RIE power: 5 W, Pressure: 1.0 Pa

Incidentally, the effect of the etching rate ratio with respect to the metal chrome layer when the chlorine gas is used may be sufficiently exhibited when the ratio of the metal layer film thickness and the cured layer film thickness is in the range of 1:10 to 1:50.

(3) Surface Free Energy

The surface free energy of the resin composition in the present disclosure is preferably 30 $mJ/m^2$ or more and 70 $mJ/m^2$ or less, and particularly preferably 30 $mJ/m^2$ or more and 50 $mJ/m^2$ or less. Within the above described range, for example, compatibility with the core material pattern formed of an organic resist material can be inhibited, and it can be sufficiently spread on the core material pattern; thus, the above range is preferable.

(4) Glass Transition Temperature

The glass transition temperature (Tg) of the cured product of the resin composition in the present disclosure is preferably 50° C. or more, and more preferably 80° C. or more. With such a glass transition temperature, heat stability is high, and deterioration due to heat generated during etching can be inhibited.

(5) Dynamic Viscoelasticity Measurement

The storage elastic modulus of the cured product of the resin composition in the present disclosure is $E'=1.0\times10^9$ Pa or more at 25° C., and preferably $E'=3.0\times10^8$ Pa or more at 150° C. The loss elastic modulus at that time is $E''=8{,}9\times10^7$ Pa or more at 25° C., and preferably $E''=1.7\times10^7$ Pa or more at 150° C. The upper limit of the storage elastic modulus (25° C.) is usually $1.0\times10^{11}$ Pa or less. Incidentally, the above described value is a value when the dynamic viscoelasticity measurement is conducted to the cured product of the resin composition of the present disclosure after irradiating 1 $J/cm^2$ an ultraviolet ray of 365 nm under non-oxygen atmosphere, and the storage elastic modulus (E') and the loss elastic modulus (E") can be measured according to JIS K7244 using Rheogel E-4000 from UBM Corporation.

Usually, the storage elastic modulus E' and the loss elastic modulus E" of a plastic material decrease at the glass transition temperature Tg or more. The change in the elastic modulus of the cured product of the resin composition in the present disclosure is small even at a high temperature such as the glass transition temperature or more, and the heat stability is high, and thus, for example, pattern forms can be maintained.

(6) Elastic Deformation Power

The elastic deformation power of the cured product of the resin composition in the present disclosure (particularly the composition including polymerizable compound with the spherical structure) at a room temperature (25° C.) may be 50% or more. The closer the elastic deformation power is to 100%, the easier elastic deformation is. Since the cured product of the resin composition in the present disclosure is able to exhibit characteristics of easy elastic deformation as described above, for example, when a resist pattern is formed by imprinting using the resin composition in the present disclosure, the resist pattern with characteristics of returning (recovering) tilted or fallen pattern, can be formed. Incidentally, the elastic deformation power in the present disclosure can be obtained by conducting a vertical indentation test in the below conditions using Nano-intender (HM500 from FISCHER INSTRUMENTS K.K.), and applying the load-displacement curve obtained therefrom to the following formula:

Total deformation power=elastic deformation power+plastic deformation power;

Elastic deformation power (%)=(elastic deformation power/total deformation power)×100;

(Measurement Conditions)

Maximum indentation load: 1.0 mN.

(7) Refractive Index

The refractive index of the cured product of the resin composition in the present disclosure is not particularly limited, but is preferably 1.40 to 1.60, and more preferably 1.45 to 1.55.

Also, the difference of the refractive index from that of the standard resist is preferably 0.05 or more and more preferably 0.07 or more. When the difference of the refractive index from that of the standard resist is the above value or more, the cured layer 4 filled in the gap of the core material pattern 3 (convex part) in the reverse process may be left in the step of etching the cured layer 4 (FIG. 1 (*d*)), so that whether the top portion of the core material pattern 3 is exposed can be easily judged by monitoring with a microscope or an optical interference film thickness meter, and etching of the core material pattern 3 in the next step can be easily conducted.

7. Application

There are no particular limitations on the application of the curable resin composition for silicon-containing resist in the present disclosure, and it can be used for application for the purpose of forming a flat layer by pasting the resin composition on a concave and convex structure body including concave and convex on its surface, and further, after curing, it can be used for etching process. In specific, usage in "B. Pattern forming method", "C. Method for producing imprint mold", and "D. Method for producing semiconductor device", which will be described later, is preferable.

B. Pattern Forming Method

The pattern forming method in the present disclosure will be hereinafter explained with reference to drawings. The pattern forming method in the present disclosure is a method for forming pattern in a workpiece substrate using the curable resin composition for silicon-containing resist described above. As described above, the resin composition in the present disclosure has excellent filling ability and flattening ability with respect to a concave and convex structure body. For this reason, it can be particularly suitably used in a pattern forming method by a reverse process (first embodiment), and a pattern forming method for multi-stepped concave and convex structure (second embodiment) as follows.

1. Pattern Forming Method by Reverse Process (First Embodiment)

FIGS. 1 and 2 are schematic process drawings showing an example of the pattern forming method in the present disclosure using the reverse process, and it is a method for forming pattern in the workpiece substrate 1 by using a complex body of the work piece substrate 1, the hard mask layer 2 formed on the workpiece substrate, and the core material pattern 3 formed on the hard mask layer 2, as the concave and convex structure body 10 including concave and convex X1 on its surface, and by using the curable resin composition for silicon-containing resist as a reversal layer material.

(1) Pasting Step

The pattern forming method in the present disclosure includes a pasting step of pasting the curable resin composition for silicon-containing resist 14 on the concave and convex structure body 10 with the concave and convex X1 on its surface so as to cover the concave and convex X1 (FIG. 1 (*a*), (*b*)). The resin composition in the present disclosure has low viscosity, and thus generation of babbles during pasting on the concave and convex structure body can be inhibited, and pasting with excellent filling ability is achieved.

As the concave and convex structure body, as shown in FIGS. 1 to 2, the concave and convex structure body 10 including the workpiece substrate 1, the hard mask layer 2 formed on the workpiece substrate, and the core material pattern 3 (convex part) formed on the hard mask layer 2, can be used.

Examples of the workpiece substrate may include a workpiece substrate for an imprint mold and a workpiece substrate for semiconductor device.

For example, when the purpose of pattern forming is production of an imprint mold, a material suitable for the substrate of the imprint mold can be selected. In specific, when the resist, which is used in imprinting with the imprint mold to be produced, is photocurable, a material which allows transmittance of irradiation light for curing can be used; for example, glasses such as quartz glass, boron silica glass, calcium fluoride, magnesium fluoride, and acrylic glass; sapphire and gallium nitride; and resins such as polycarbonate, polystyrene, acryl, and polypropylene; or arbitrary layered material of these can be used. Also, when the resist used is not photocurable or when light for curing the resist can be irradiated from the side of the substrate to which pattern used for imprinting will be formed, the workpiece substrate may not be provided with optical transparency, and materials such as metals such as silicon, nickel, titanium and aluminum, and alloys, oxides, and nitrides of these, or arbitrary layered material of these can be used, other than the above described materials.

Also, when the purpose of pattern forming is production of materials such as semiconductor element and micro wiring, as the workpiece substrate, metals such as silicon, nickel, titanium, and aluminum, and alloys, oxides, nitrides of these, or arbitrary layered materials of these can be used. Further, the material of the workpiece substrate can be appropriately selected according to the purpose of the pattern forming.

As the hard mask layer to be formed on the workpiece substrate, for example, metals such as chrome, titanium, tantalum, silicon, and aluminum; chrome compounds such as chrome nitride, chrome oxide, and chrome oxynitride; tantalum compounds such as tantalum oxide, tantalum oxynitride, tantalum oxyboride, and tantalum oxynitride boride; titanium nitride, silicon nitride, silicon oxide, and silicon oxynitride may be used solely or two or more kinds thereof arbitrary selected in combination may be used.

The hard mask layer is subjected to patterning in the later described step (FIG. 2 (*f*) for reference), and used as a mask during etching the workpiece substrate. For this reason, the constituents of the hard mask layer are preferably selected according to the kind of the workpiece substrate, considering the factors such as the etching selectivity. For example, when the workpiece substrate is a quartz glass substrate, materials such as a metal chrome film can be suitably selected as the hard mask layer.

The thickness of the hard mask layer is appropriately arranged in consideration of the etching selectivity according to the kind of the workpiece substrate, and the aspect ratio of the concave and convex pattern in the workpiece substrate to be produced. For example, when an imprint mold is produced, the thickness of the hard mask layer can be arranged to the extent of 1.0 nm to 5.0 nm.

There are no particular limitations on the method for forming the hard mask layer, and examples thereof may include known film forming methods such as spattering, PVD (Physical Vapor Deposition), and CVD (Chemical Vapor Deposition).

The method for forming the core material pattern may be conventionally known forming methods. For example, it can be formed by imprinting method using a known organic resist material (such as ultraviolet curing resin and thermosetting resin), and it can also be formed by an electron beam lithography method or a photo lithography method by pasting electron beam sensitive or photosensitive organic resist material.

The curable resin composition for silicon-containing resist is described in "A. Curable resin composition for silicon-containing resist" above; thus, the descriptions herein are omitted.

Examples of the method for pasting the curable resin composition for silicon-containing resist on the concave and convex of the concave and convex structure body may include, a method of discretely supplying droplets of the reversal layer forming material from an ink-jet nozzle by an ink-jet method, a method of supplying the reversal layer forming material on a plate onto the concave and convex with a squeegee by a plate printing method such as stencil printing (screen printing), a die-coat method and a spin-coat method. In the present disclosure, among them, the ink-jet method is preferable.

(2) Flattening Step

The pattern forming method in the present disclosure preferably includes a flattening step (FIG. 1 (*c*)) after (1) Pasting step described above. The flattening step is a step of obtaining the cured layer 4 by curing the curable resin composition for silicon-containing resist 14 pasted on the concave and convex structure body 10 in a state a flat plate mold 5 is pushed against from upper side.

By conducting the flattening step in this manner, the curable resin composition for silicon-containing resist can be spread onto the concave and convex, and also the upper surface of the cured layer can be flattened. As described above, the resin composition in the present disclosure substantially does not include a solvent, and thus a cured layer with excellent flatness can be obtained.

When the resin composition is cured by light irradiation, the light irradiation may be conducted from the flat plate mold side, and when for example, the workpiece substrate is transparent and the flat plate mold is opaque, light irradiation may be conducted from the workpiece substrate side. The light to be irradiated is appropriately selected according to the sensitivity wavelength of the resin composition. For example, ultraviolet rays of wavelength in a range of 150 nm to 400 nm, X-rays, and electron rays may be used, and ultraviolet rays are particularly preferably used. Examples of the light source for emitting ultraviolet rays may include a high-pressure mercury lamp, an ultra-high-pressure mercury lamp, a low-pressure mercury lamp, a Deep-UV lamp, a carbon arc lamp, a chemical lamp, a metal halide lamp, a xenon lamp, a KrF excimer laser, ArF excimer laser, and an $F_2$ excimer laser, and an ultra-high-pressure mercury lamp is particularly preferable.

When the resin composition is cured by heating, the temperature is preferably set to 40° C. or more and 120° C. or less.

The flat plate mold to be pushed against (made contact with) the curable resin composition for silicon-containing resist is not particularly limited, but usage of transparent substrate such as a quartz glass is preferable if an active energy ray is irradiated interposing the flat plate mold during curing the resin composition. Also, when the workpiece substrate is transparent, and the resin composition can be cured by irradiating an active energy ray from the surface of the workpiece substrate that is opposite to the surface where the concave and convex are formed, an opaque substrate (such as the one with low transparency of the active energy ray (less than 85%, for example)) may be used as the flat plate mold. Further, the surface roughness (Ra) of the flat plate mold, which is of the surface pushed against (made contact with) the reversal layer forming material, is preferably 0.1 nm to 1.0 nm, and more preferably 0.2 nm to 0.5 nm. Production of the flat plate mold including a surface with the said surface roughness (Ra) being less than 0.1 nm is difficult in the first place. Meanwhile, if the surface roughness (Ra) exceeds 1.0 nm, there is a risk that the size accuracy of the pattern formed in the workpiece substrate may be degraded.

Also, as the flat plate mold, one with gas permeability is preferable. With gas permeability, even when babbles (such as helium gas) remain in the concave part of the concave and convex structure body, the gas can be absorbed and permeated to the flat plate mold, and thus generation of defect in the cured layer of the resin composition can be inhibited.

Examples of the flat plate mold with such a gas permeability may include one wherein $TiO_2$—$SiO_2$ glass is used (such as WO2011/096368). The $TiO_2$—$SiO_2$ glass has merits such that optical transparency and heat stability are equal to or more excellent than those of a synthesized quartz glass.

The flat plate mold is preferably easily peeled off from the cured layer after completion of the flattening step. On the other hand, from the viewpoint of obtaining the desired etching properties, additives such as a mold releasing agent is preferably not included in the curable resin composition in the present disclosure. For this reason, in order to improve mold release characteristics, a mold releasing layer is preferably formed on the surface of the flat plate mold in advance. There are no particular limitations on the mold releasing layer if the material allows peeling force to decrease, and examples thereof may include a fluorine material, a silicone material, and a long chain alkyl material. Examples of the film forming method of the mold releasing layer may include spin-coat, a vapor deposition method, and a spray method.

Also, a mold releasing agent may be transferred to the flat plate mold by an imprint method. In specific, techniques of JPB5714496 and JPB5889388 can be used. In these techniques, a resist including a mold releasing agent (fluorine-containing surfactant) is formed on a substrate, and a flat plate mold is pushed against the resist, so that by hydrogen bonding interaction, the material such as a hydroxyl group in the surface of the flat plate mold more strongly gathers with the material such as a hydroxyl group in the mold releasing agent segregated in the resist surface, and the mold releasing agent is transferred to the surface of the flat plate mold.

(3) Cured Layer Etching Step

The cured layer 4 formed in the manner such as FIG. 1 (*a*) to (*c*) described above, is filled in the gap of the core material pattern 3 (convex part), and also is present on the core material pattern 3. This cured layer 4 present on the core material pattern 3 is removed by dry etching to expose the top portion of the core material pattern 3, and also, the cured layer 4 is etched so as to leave the cured layer 4 (reversal layer) filled in the gap (concave part) of the core material pattern 3 (refer to FIG. 1 (*d*)).

As the etching gas to etch the cured layer, for example, a fluorine-based gas can be used. Whether the top portion of the core material pattern (convex part) is exposed or not can be confirmed by visual observation, a stylus type step profiler, and an AFM (Atomic Force Microscope).

(4) Reversal Pattern Forming Step

Sequentially, the core material pattern 3 (convex part) exposed is removed by a dry etching method using the cured layer 4 filled in the gap of the core material pattern 3 (convex part) as a mask. As described above, the resin composition in the present disclosure is a material with sufficient etching selectivity between the resist resin configuring the core material pattern 3, and thus reversal pattern 4*p* can be formed on the hard mask layer 2 by removing the core material pattern 3 (convex part) (refer to FIG. 2 (*e*)).

The etching gas to etch the core material pattern 3 can be appropriately selected according to the kind of the resist resin configuring the core material pattern 3, but for example, oxygen can be used. Here, the film thickness of the reversal pattern 4*p* is preferably confirmed with measures such as an AFM.

(5) Hard Mask Pattern Forming Step

Hard mask pattern 2*p* is formed by etching the hard mask layer 2 by, for example, a dry etching treatment with a chlorine-based etching gas, using the reversal pattern 4*p* as a mask (refer to FIG. 2 (*f*)). The resin composition in the present disclosure is a material with sufficient etching selectivity between the hard mask layer (particularly metal chrome layer), and thus the hard mask pattern 2*p* can be formed.

(6) Workpiece Substrate Etching Step

Finally, the workpiece substrate 1 is subjected to a dry etching treatment using the hard mask pattern 2*p* as a mask, a concave and convex pattern is formed in the workpiece substrate, and concave and convex pattern forming body 1*p* is obtained (refer to FIG. 2 (*g*)). Examples of the etching gas may include a fluorine based gas. After that, the reversal pattern 4*p* may be removed by measures such as wet etching (FIG. 2 (*h*)).

With the pattern forming method of the present disclosure, the cured layer 4 with excellent filling ability and flatness can be formed. Thus, by the etching treatment using the reversal pattern 4*p* obtained from the said reversal layer 4 as a mask, precise fine pattern (such as in size 20 nm or less) can be formed in the workpiece substrate.

2. Pattern Forming Method of Multi-Stepped Concave and Convex Structure

Figure 3:
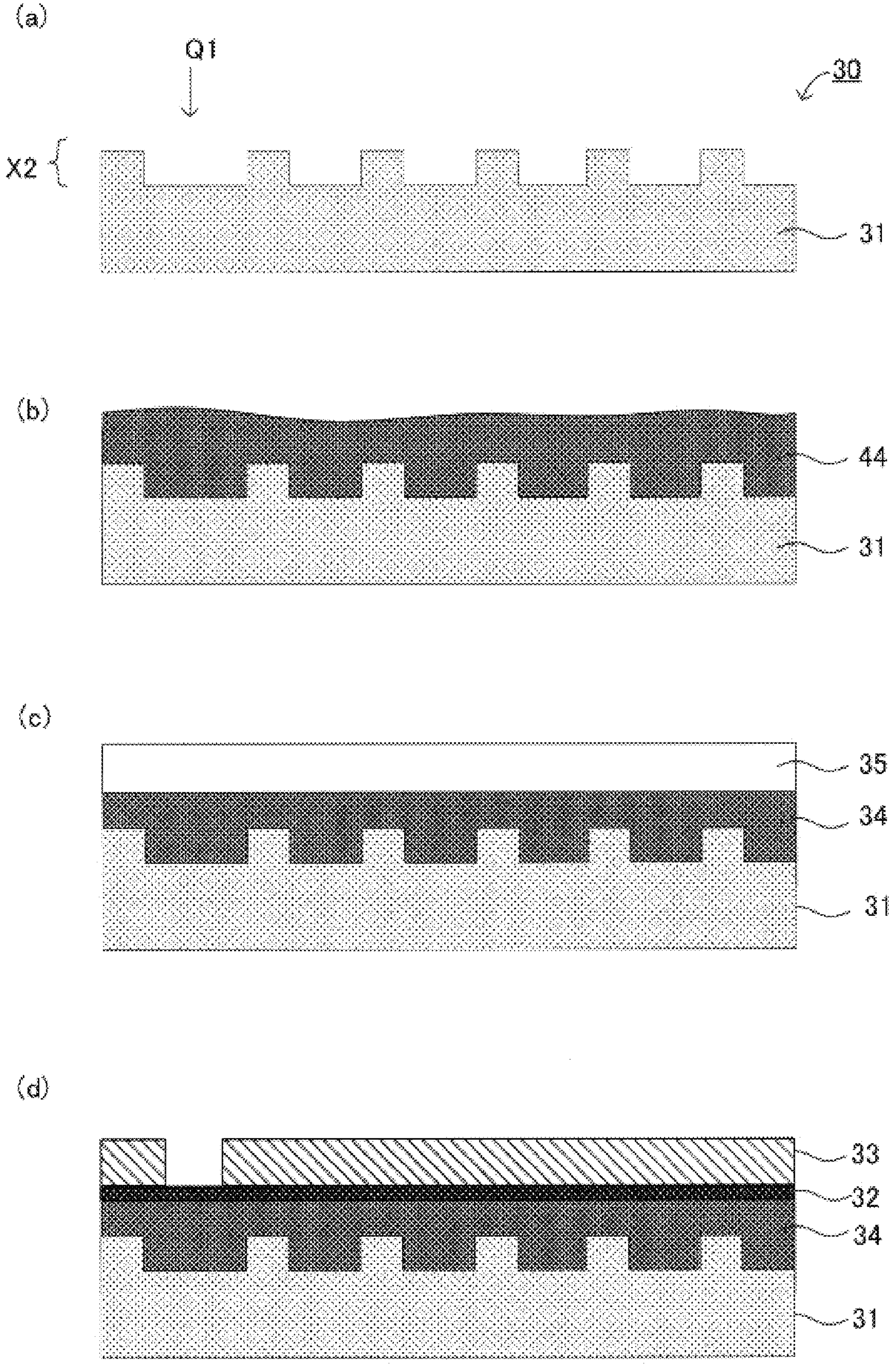
FIG. 3 (*a*) to (*d*) are schematic process drawings of the pattern forming method (second embodiment) using the curable resin composition for silicon-containing resist of the present disclosure.
Figure 4:
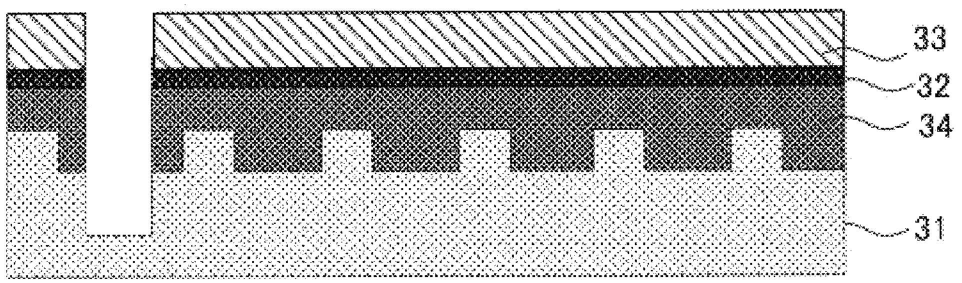
FIGS. 4 (*e*) and (*f*) are schematic process drawings of the pattern forming method (second embodiment) using the curable resin composition for silicon-containing resist of the present disclosure.
Figure 4:
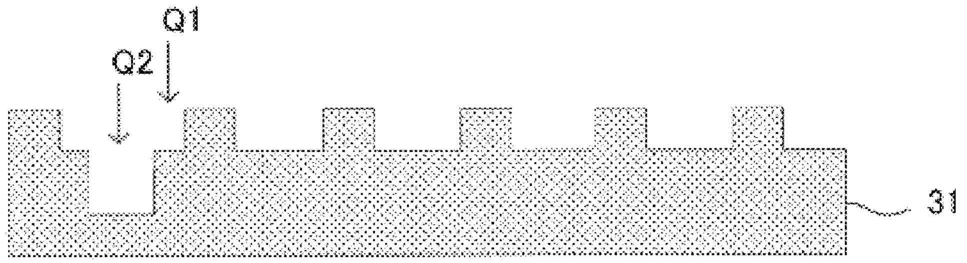
Figure 5:
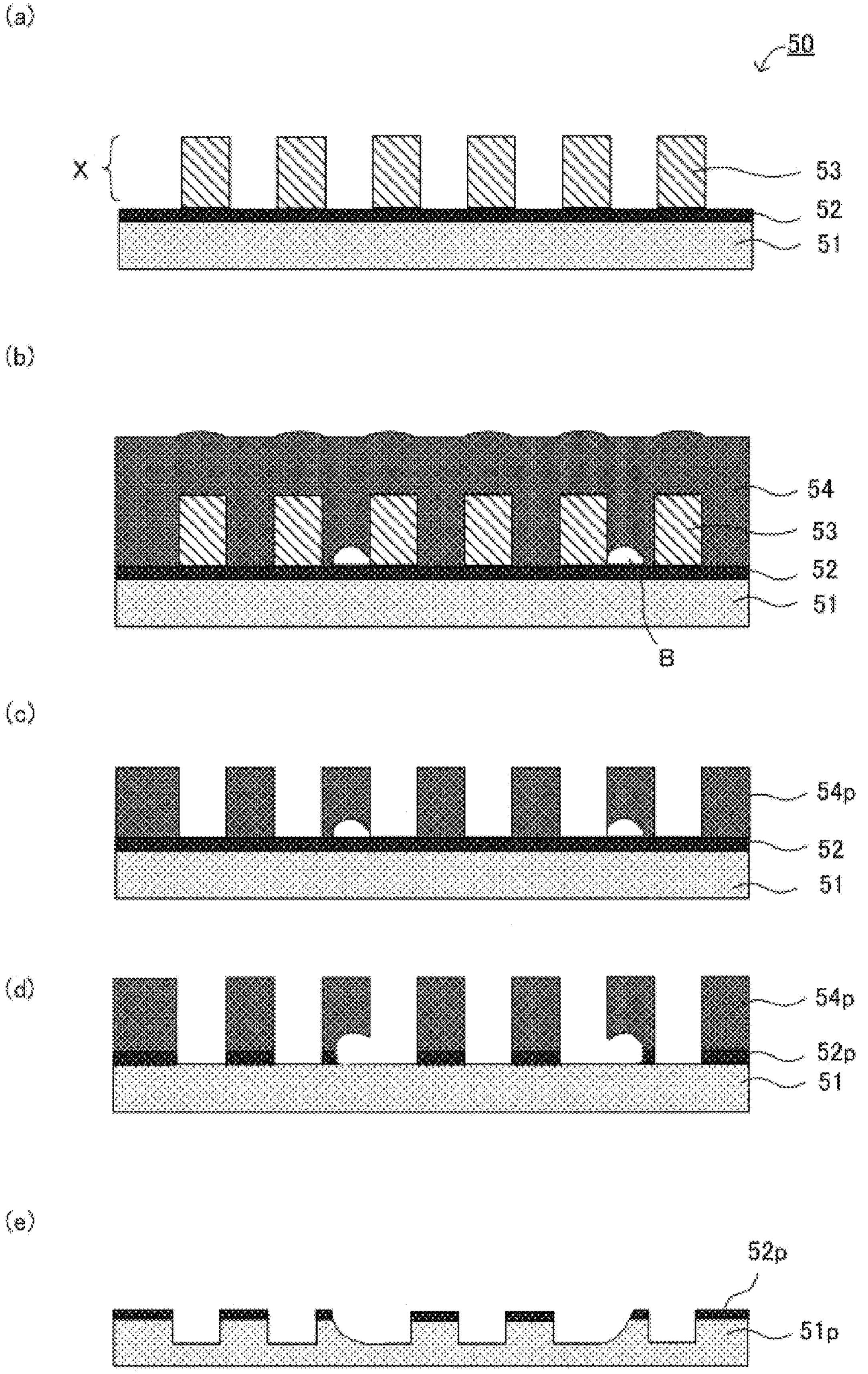
FIG. 5 (*a*) to (*e*) are schematic cross-sectional views explaining the pattern forming method by a conventional reverse process.

FIG. 3 and FIG. 4 are schematic process drawings showing an example of the pattern forming method of the multi-stepped concave and convex structure, and it is a method of forming concave parts (Q1, Q2) with different depth in the workpiece substrate 31 (concave and convex structure body 30) including concave and convex X2 on its surface, by conducting an etching process thereto using the resin composition of the present disclosure.

(1) Pasting Step

The pattern forming method in the present disclosure includes a pasting step of pasting the curable resin composition for silicon-containing resist 44 on the concave and convex structure body 30 with the concave and convex X2 on its surface so as to cover the concave and convex X2 (FIG. 3 (*a*), (*b*)). The resin composition in the present disclosure has low viscosity, and thus generation of babbles during pasting on the concave and convex structure body can be inhibited, and pasting with excellent filling ability is achieved.

Examples of the concave and convex structure body used in the present embodiment may include those in which the workpiece substrate 31 itself includes the concave and convex X2 on its surface as shown in FIGS. 3 to 4. Examples of the materials of the workpiece substrate may include those described in "1. Pattern forming method by reverse process (first embodiment)" above.

(2) Flattening Step

The pattern forming method in the present embodiment preferably includes a flattening step after (1) Pasting step described above (FIG. 3 (*c*)). The flattening step is a step of obtaining the cured layer 34 by curing the curable resin composition for silicon-containing resist 44 pasted on the concave and convex structure body 30 in a state a flat plate mold 35 is pushed against from upper side. Examples of the flat plate mold may include those described in "1. Pattern forming method by reverse process (first embodiment)" above.

(3) Resist Pattern Forming Step

The cured layer 34 formed in the manners as in FIGS. 3 (*a*) to (*c*) as described above, can be pasted with excellent filling ability in the concave part Q1 of the work piece substrate 31 (concave and convex structure body 30) including the concave and convex X2 on its surface. An organic resist layer is formed on the cured layer 34 formed on the workpiece substrate 31, which is formed in the manners as described above, and then patterning of the organic resist layer is conducted to form organic resist pattern 33 (FIG. 3 (*d*)). Incidentally, as shown in FIG. 3 (*d*), hard mask layer 32 may be formed between the cured layer 34 and the organic resist pattern 33. Examples of the materials and the forming methods of the organic resist layer (organic resist pattern) and the hard mask layer may include, respectively, the same materials and forming methods for the organic resist material and the hard mask layer of the core material pattern in "1. Pattern forming method by reverse process (first embodiment)" described above.

(4) Workpiece Substrate Etching Step

The workpiece substrate 31 including concave and convex on its surface is subjected to an etching process using the organic resist pattern 33 as a mask (FIG. 4 (*e*), (*f*)). Gas used in dry etching may be appropriately selected according to the elemental composition of the workpiece substrate, and for example, chlorine-based gas and fluorine-based gas can be used. These gases may be used alone, or as an appropriate mixture.

Thereby, in addition to the concave part Q1, deeper concave part Q2 can be formed, and the workpiece substrate with multi-stepped concave and convex structure can be produced.

C. Method for Producing Imprint Mold

Next, the method for producing the imprint mold in the present disclosure will be described with reference to drawings. The method for producing the imprint mold in the present disclosure is a method for producing an imprint mold using "B. Pattern forming method" described above.

In specific, "B. Pattern forming method 1. Pattern forming method by reverse process (first embodiment)" described above can be used. Usually, substrate for imprint mold 61 includes base part 61*a* including a first surface and a second surface opposing thereto, and convex structure part 61*b* (so-called mesa structure) that protrudes from the first surface and where the concave and convex pattern is formed (such as FIG. 6 (*a*)). In the reverse process, when the conventional reversal layer material is pasted on the core material pattern formed on the convex structure part, the film thickness of the outer periphery of the reversal layer increases compared to the film thickness of the inner side. In other words, there was a problem of uneven film thickness of the reversal layer formed on the core material pattern. In the imprint mold, the concave and convex pattern may be formed until extremely close to the outer periphery of the convex structure part, so that when the film thickness of the outer periphery of the reversal layer formed on the core material pattern is more than the film thickness of the inner side, the size preciseness of the concave and convex pattern, which will be formed on the convex structure part by the etching treatment using the reversal layer as a mask, may be degraded.

Figure 6:
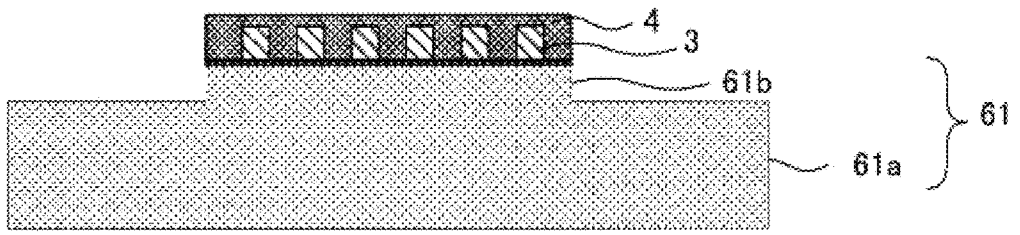
FIGS. 6 (*a*) and (*b*) are schematic process drawings exemplifying the method for producing an imprint mold in the present disclosure.
Figure 6:
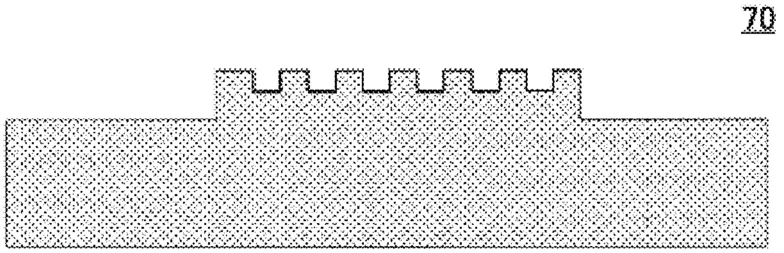

According to the present disclosure, as reasons described above, when the resin composition is pasted on the core material pattern 3 formed in the convex structure part 61*b* of the substrate for imprint mold 61 as shown in FIG. 6 (*a*), the film thickness of the outer periphery does not increase compared to the film thickness of the inner side, and thus the cured layer 4 (reversal layer) can be formed with excellent filling ability and flatness. For this reason, imprint mold 70 in which precise fine pattern is formed can be produced (FIG. 6 (*b*)).

Also, according to the method described in "B. Pattern forming method 2. Pattern forming method of multi-stepped concave and convex structure (second embodiment)" above, an imprint mold in which the multi-stepped concave and convex structure is formed can be produced.

D. Method for Producing Semiconductor Device

The method for producing the semiconductor device in the present disclosure is a method for producing a semiconductor device using the pattern forming method described above. In specific, by conducting the reversal process (first embodiment) and pattern forming method of the multi-stepped structure (second embodiment) described in "B. Pattern forming method" above, using a workpiece substrate for semiconductor device, a semiconductor with highly precise pattern formed can be produced.

Such a semiconductor device can be used for integration of devices such as an integration circuit or sensor, and an optical device.

Incidentally, the present disclosure is not limited to the embodiments. The embodiments are exemplification, and any other variations are intended to be included in the technical scope of the present disclosure if they have substantially the same constitution as the technical idea described in the claims of the present disclosure and have similar operation and effect thereto.

EXAMPLES

The present disclosure is hereinafter explained in further details with reference to Examples and Comparative Examples.

Example 1

The below hard mask layer was formed on a workpiece substrate (quartz glass), a resist layer configured by the below EB resist material with the film thickness of 30 nm was formed on the hard mask layer, and a core material pattern was obtained by an electron beam lithography. Next, the below composition A for forming reversal layer was pasted on the core material pattern, and cured in a state a flat plate mold was pushed against from the upper side, and thereby a cured layer was obtained (FIG. 1 (*a*) to (*c*)). Next, in the conditions described in "6. Other physical properties (2) Etching properties" above, etching processes were conducted using a fluorine gas for etching the cured layer shown in FIG. 1 (*d*), using an oxygen gas for etching the core material pattern shown in FIG. 2 (*e*), and using a chlorine gas for etching the hard mask layer shown in FIG. 2 (*f*), and thereby a pattern of 17 nm width (W in FIG. 2 (*h*)) was formed in the workpiece substrate.

Comparative Example 1

Etching processes of the workpiece substrate were conducted in the same manner as in Example except that composition B for forming reversal layer was used instead of composition A for forming reversal layer.

Comparative Example 2

Etching processes of the workpiece substrate were conducted in the same manner as in Example except that composition C for forming reversal layer was used instead of the composition A for forming reversal layer.

Example 2

Etching processes of the workpiece substrate were conducted in the same manner as in Example except that composition D for forming reversal layer was used instead of the composition A for forming reversal layer.

Comparative Example 3

Etching processes of the workpiece substrate were conducted in the same manner as in Example except that composition E for forming reversal layer was used instead of the composition A for forming reversal layer.

Table 1 shows the viscosity of the below compositions A to E, and the etching rate ratio using a fluorine gas with respect to a standard resist, the etching rate ratio using an oxygen gas with respect to a standard resist, and the etching rate ratio using a chlorine gas with respect to a metal chrome layer, of the compositions A to E. As the standard resist, the standard resist described in "A. Curable resin composition for silicon-containing resist 6. Other physical properties (1) Wettability" above was used.

Table 1 shows the results of observing the presence or absence of the defect of patterns formed in the workpiece substrates. The microscope pictures of, the core material pattern formed in Example, the reversal pattern, and the workpiece substrates (in the state of FIG. 2 (*h*)) after the pattern forming are respectively shown in FIG. 7 (A) to (C).

(Composition a for Forming Reversal Layer)

A curable resin composition for silicon-containing resist including the below polymerizable compound A with a spherical structure, reactive crosslinking agent, and photopolymerization initiator was used.

Polymerizable Compound:

Polymerizable compound A with a spherical structure: 20 mass %.

[Chemical 4]

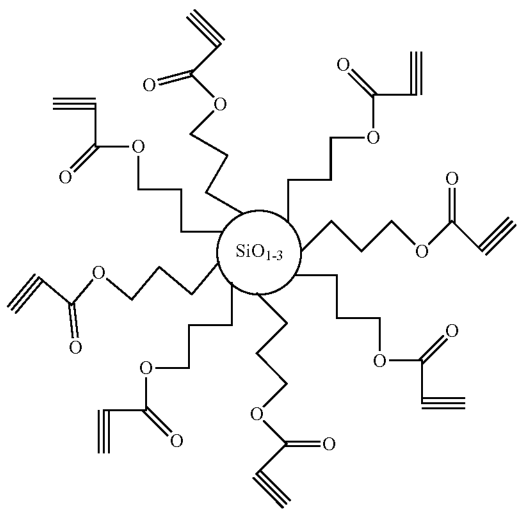

Incidentally, the polymerizable compound A was produced in the following method:

Reactive Crosslinking Agent:

Dimethylsiloxane-containing bifunctional acrylate 79 mass %;

Photopolymerization Initiator:

Omnirad907 1.0 mass %.

(Synthesis Method of Polymerizable Compound A)

To 93.9 g of acetone, 11.7 g of 3-acryloxypropyltrimethoxysilane was dissolved, and warmed to ° C. A mixed solution of 13.5 g of ion-exchanged water and g of potassium carbonate ($K_2CO_3$) was added dropwise thereto, and the mixture was stirred at 50° C. for 5 hours. The resulting reaction solution was washed with saturated saline and chloroform to extract. The volatile components were removed to obtain a polymerizable compound A with a spherical structure.

(Composition B for Forming Reversal Layer)

Polymerizable Compound:

The polymerizable compound A: 99 mass %;

Photopolymerization Initiator:

Omnirad907 1.0 mass %.

(Composition C for Forming Reversal Layer)

Dimethylsiloxane skeleton silicone resin composition: 10 mass %;

4-Methyl-2-pentanol: 90 mass %.

(Composition D for Forming Reversal Layer)
Polymerizable Compound:
The polymerizable compound A: 35 mass %;
Reactive Crosslinking Agent:
Dimethylsiloxane-containing bifunctional acrylate: 64 mass %;
Photopolymerization Initiator:
Omnirad907 1.0 mass %.
(Composition E for Forming Reversal Layer)
Polymerizable Compound:
The polymerizable compound A: 50 mass %;
Reactive Crosslinking Agent:
Dimethylsiloxane-containing bifunctional acrylate: 49 mass %;
Photopolymerization Initiator:
Omnirad907 1.0 mass %.
(EB Resist (Core Material Pattern) Material)
ZEP520A (from ZEON CORPORATION)
(Hard Mask Layer)
Metal chrome layer (film thickness: 3 nm)

TABLE 1

| | | Viscosity | Etching rate ratio | | | |
|---|---|---|---|---|---|---|
| | | [cPs] | Fluorine gas | Oxygen gas | Chlorine gas | Defect |
| Standard resist layer | | — | 1 | 1 | | — |
| Hard mask layer | | — | | | 1 | — |
| Example 1 | Composition A for forming reversal layer | 6.4 | 1.6 | 0.15 | 1.5 | Absent |
| Comp. Ex. 1 | Composition B for forming reversal layer | 4000 | 1.7 | 0.1 | 1.4 | Present |
| Comp. Ex. 2 | Composition C for forming reversal layer | 2.5 | 1.2 | 0.02 | 0.1 | Present |
| Example 2 | Composition D for forming reversal layer | 20 | 1.6 | 0.15 | 1.55 | Absent |
| Comp. Ex. 3 | Composition E for forming reversal layer | 54 | 1.65 | 0.20 | 1.6 | Present |

Figure 7:
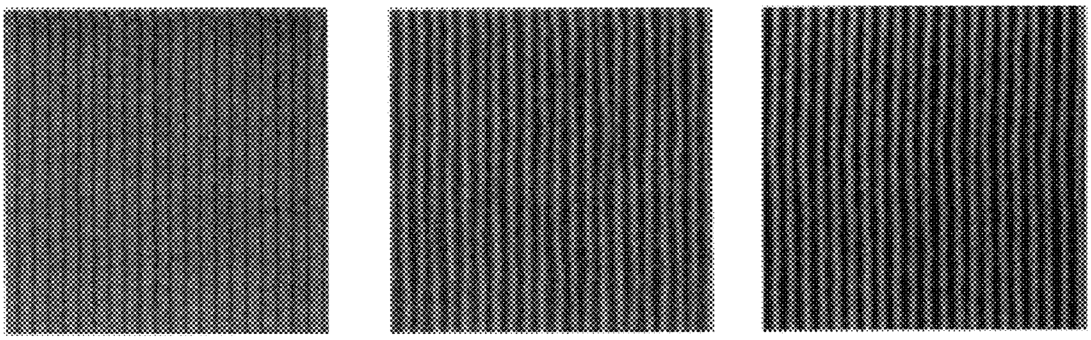
FIG. 7A to C are microscope observation pictures of the patterns formed in the workpiece substrate in Examples.

From Table 1 and FIG. 7, it was confirmed that the curable resin composition for silicon-containing resist in the present disclosure (composition A and D for forming reversal layer) had low viscosity and did not include a solvent, and thus embedding properties and flatness properties were excellent and etching properties thereof was excellent (Examples 1, 2). On the other hand, open defects (white defects) were observed in the patterns formed with the compositions B, C, E for forming reversal layer. This was presumably because the composition B, E for forming reversal layer had high viscosity, and thus the filling ability thereof to the gap of the core material pattern was poor to cause defect in the cured layer, and the composition C for forming reversal layer included a solvent, and thus the flatness of the cured layer was bad.

REFERENCE EXAMPLE

EB resist layer with the film thickness of 50 nm was formed on a workpiece substrate, and a resist pattern was obtained by an electron beam lithography. The etching process of the workpiece substrate was conducted not using the reverse process (that was, not using the resin composition of the present disclosure), and using a resist pattern as a mask, and thereby a pattern with the width of 17 nm was formed. The microscope pictures of the resist pattern and the workpiece substrate after the pattern forming are respectively shown in FIGS. 8 (A) and (B).

Figure 8:
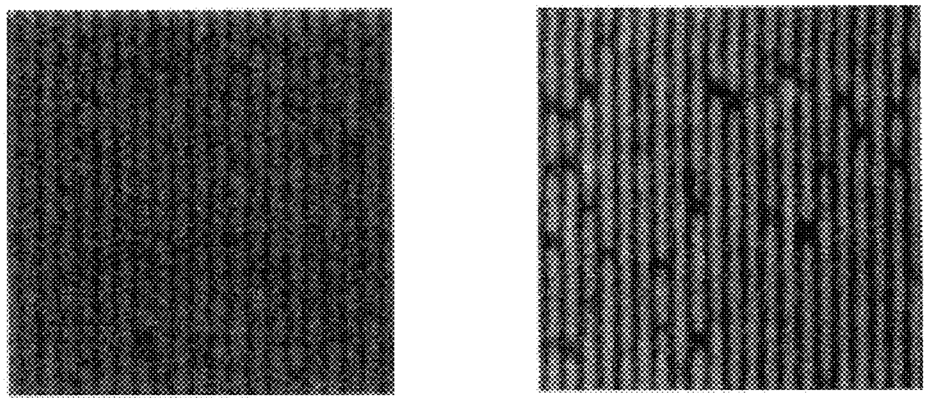
FIGS. 8A and B are microscope observation pictures of the patterns formed in the workpiece substrate in Reference Example.

From FIG. 7, it was confirmed that the highly precise fine pattern was formed by the reverse process using the resin composition of the present disclosure. On the other hand, in Reference Example, fine pattern could not be formed even when the film thickness of the resist layer was thick (FIG. 8).

1 . . . workpiece substrate
2 . . . hard mask layer
3 . . . core material pattern
4 . . . curable resin composition for silicon-containing resist
5 . . . flat plate mold
10 . . . concave and convex structure body

What is claimed is:

1. A curable resin composition for silicon-containing resist comprising a polymerizable compound, and a polymerization initiator,
wherein the polymerizable compound includes a siloxane bond in a molecule, and includes at least one polymerizable functional group; and
a ratio of oxygen atoms bonded to a single silicon atom, among oxygen atoms bonded to a silicon atom included in the polymerizable compound, is 10 mol % or less; and
the curable resin composition for silicon-containing resist does not contain a solvent, and a viscosity of the curable resin composition is 20 cPs or less.

2. The curable resin composition for silicon-containing resist according to claim 1, wherein the polymerizable compound includes a spherical structure.

3. The curable resin composition for silicon-containing resist according to claim 2, wherein the polymerizable compound does not include an oxygen atom, a nitrogen atom, a phosphorus atom, or a sulfur atom in a linking group between a siloxane polymer portion configuring a main skeleton of the spherical structure, and the polymerizable functional group.

4. The curable resin composition for silicon-containing resist according to claim 1, wherein,
an etching rate ratio of a cured product of the curable resin composition for silicon-containing resist is:
when a fluorine gas is used, 1.0 times or more with respect to a standard resist,
when an oxygen gas is used, 0.2 times or less with respect to a standard resist, and
when a chlorine gas is used, 2.0 times or less with respect to a metal chrome layer.

5. The curable resin composition for silicon-containing resist according to claim 1, wherein a contact angle with respect to a surface of a standard resist shows 20° or less.

6. A pattern forming method comprising a pasting step of pasting the curable resin composition for silicon-containing resist according to claim 1, on a concave and convex structure body with a concave and convex on its surface so as to cover the concave and convex, wherein an etching process is performed in the concave and convex structure body using a cured layer of the curable resin composition for silicon-containing resist.

7. The pattern forming method according to claim 6, further comprising a flattening step of obtaining the cured layer by curing the curable resin composition for silicon-containing resist pasted on the concave and convex structure body in a state a flat plate mold is pushed against from upper side.

8. The pattern forming method according to claim 7, wherein:

the concave and convex structure body includes a workpiece substrate, a hard mask layer formed on the workpiece substrate, and a core material pattern formed on the hard mask layer and configured by an organic resist material;

the method comprising:

a step of forming a reversal pattern of the core material pattern and supplementary the cured layer, by etching and removing the core material pattern after the flattening step;

a step of forming a hard mask pattern by etching the hard mask layer using the reversal pattern as a mask; and a step of etching the workpiece substrate using the hard mask pattern as a mask.

9. The pattern forming method according to claim 7, wherein:

the concave and convex structure body is a workpiece substrate with a concave and convex on its surface, the method further comprising:

after the flattening step, a step of forming an organic resist pattern on the cured layer, and a step of etching processing the cured layer and the workpiece substrate using the organic resist pattern as a mask.

10. A method for producing an imprint mold, wherein the imprint mold is produced by using the pattern forming method according to claim 6.

11. A method for producing a semiconductor device, wherein the semiconductor device is produced by using the pattern forming method according to claim 6.

* * * * *